United States Patent
Sun et al.

(10) Patent No.: US 9,372,952 B1
(45) Date of Patent: Jun. 21, 2016

(54) METHODS, SYSTEMS, AND ARTICLES OF MANUFACTURE FOR ENHANCING METRICS OF ELECTRONIC DESIGNS USING DESIGN RULE DRIVEN PHYSICAL DESIGN IMPLEMENTATION TECHNIQUES

(71) Applicant: Cadence Design Systems, Inc., San Jose, CA (US)

(72) Inventors: Ganping Sun, Fremont, CA (US); Pujiang Huang, Monte Sereno, CA (US); Jianmin Li, Los Gatos, CA (US); Taufik Arifin, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 151 days.

(21) Appl. No.: 14/201,772

(22) Filed: Mar. 7, 2014

(51) Int. Cl.
*G06F 17/50* (2006.01)

(52) U.S. Cl.
CPC ........ *G06F 17/5077* (2013.01); *G06F 17/5081* (2013.01); *G06F 17/5068* (2013.01); *G06F 17/5072* (2013.01)

(58) Field of Classification Search
None
See application file for complete search history.

(56) References Cited

U.S. PATENT DOCUMENTS

| | | | | |
|---|---|---|---|---|
| 6,014,507 A * | 1/2000 | Fujii | ................... | G06F 17/5077 716/129 |
| 7,010,770 B2 * | 3/2006 | Liang | ................... | G06F 17/5081 716/112 |
| 7,594,207 B2 | 9/2009 | Mantik et al. | | |
| 7,665,051 B2 * | 2/2010 | Ludwig | ............... | G06F 17/5081 430/30 |
| 7,698,679 B2 * | 4/2010 | Rizzo | ................... | G06F 17/5077 716/126 |
| 7,865,861 B2 * | 1/2011 | Habitz | ................ | G06F 17/5077 716/130 |
| 7,926,005 B1 | 4/2011 | Li et al. | | |
| 8,239,806 B2 * | 8/2012 | Chen | ................... | G06F 17/5077 716/126 |
| 8,448,100 B1 * | 5/2013 | Lin | ........................ | G03F 1/70 716/50 |
| 8,645,899 B2 * | 2/2014 | Widiger | ............. | G06F 17/5036 716/104 |
| 8,782,570 B1 | 7/2014 | Li et al. | | |
| 8,802,574 B2 * | 8/2014 | Yuan | ........................ | G03F 1/70 216/47 |
| 8,863,048 B1 | 10/2014 | Gerousis et al. | | |
| 2011/0113400 A1 * | 5/2011 | Melzner | ............. | G06F 17/5077 716/129 |
| 2012/0091592 A1 * | 4/2012 | Chen | ................... | H01L 21/0337 257/773 |
| 2012/0131528 A1 * | 5/2012 | Chen | ................... | G06F 17/5077 716/112 |

* cited by examiner

*Primary Examiner* — Leigh Garbowski
(74) *Attorney, Agent, or Firm* — Vista IP Law Group, LLP

(57) ABSTRACT

One aspect identifies an interconnect and associated design rule(s) and moves a portion of the interconnect to an adjacent track by using a spreading process on a one-dimensional design data based on the design rule(s) to determine whether the interconnect including the moved portion provides a DRC clean implementation. This aspect examines an interconnect in its entirety without being confined within a prescribed boundary of a fixed region in the layout. The one-dimensional design data provides expedient runtime and may be converted back into two-dimensional form for the layout. Another aspect iterates through multiple spreading distances to route or modify interconnects in a layout by performing multiple Boolean operations on the interconnect and adjacent shape(s) to determine the final form of the newly created or modified interconnect complying with various design rules.

25 Claims, 26 Drawing Sheets

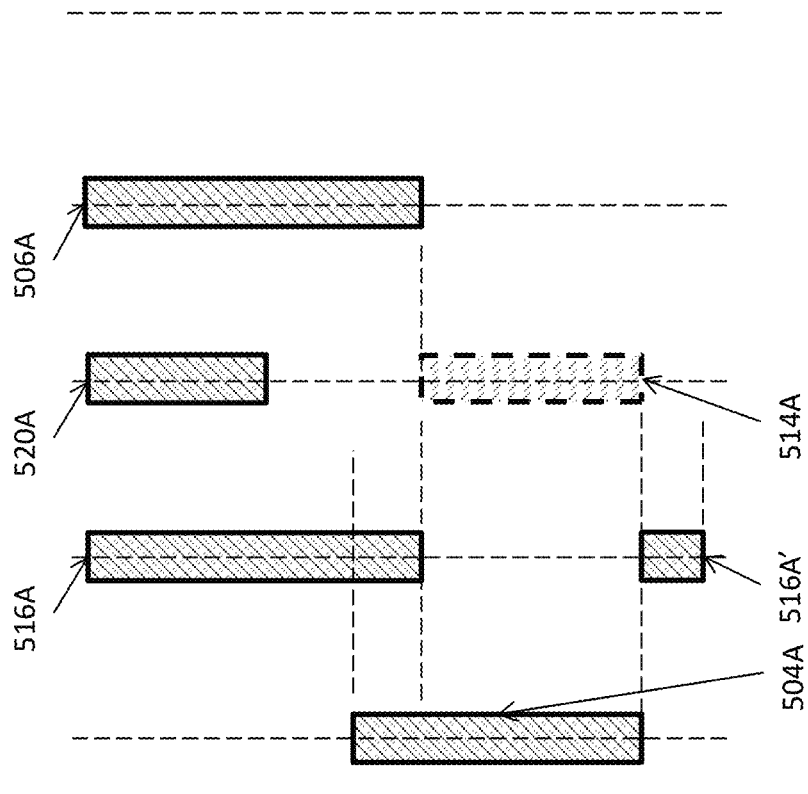

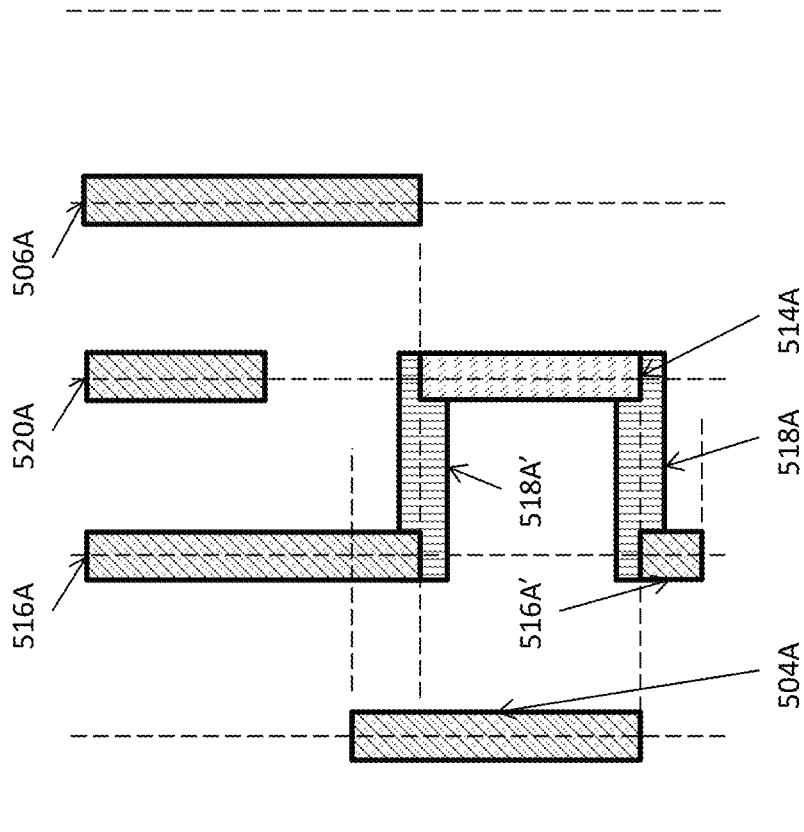

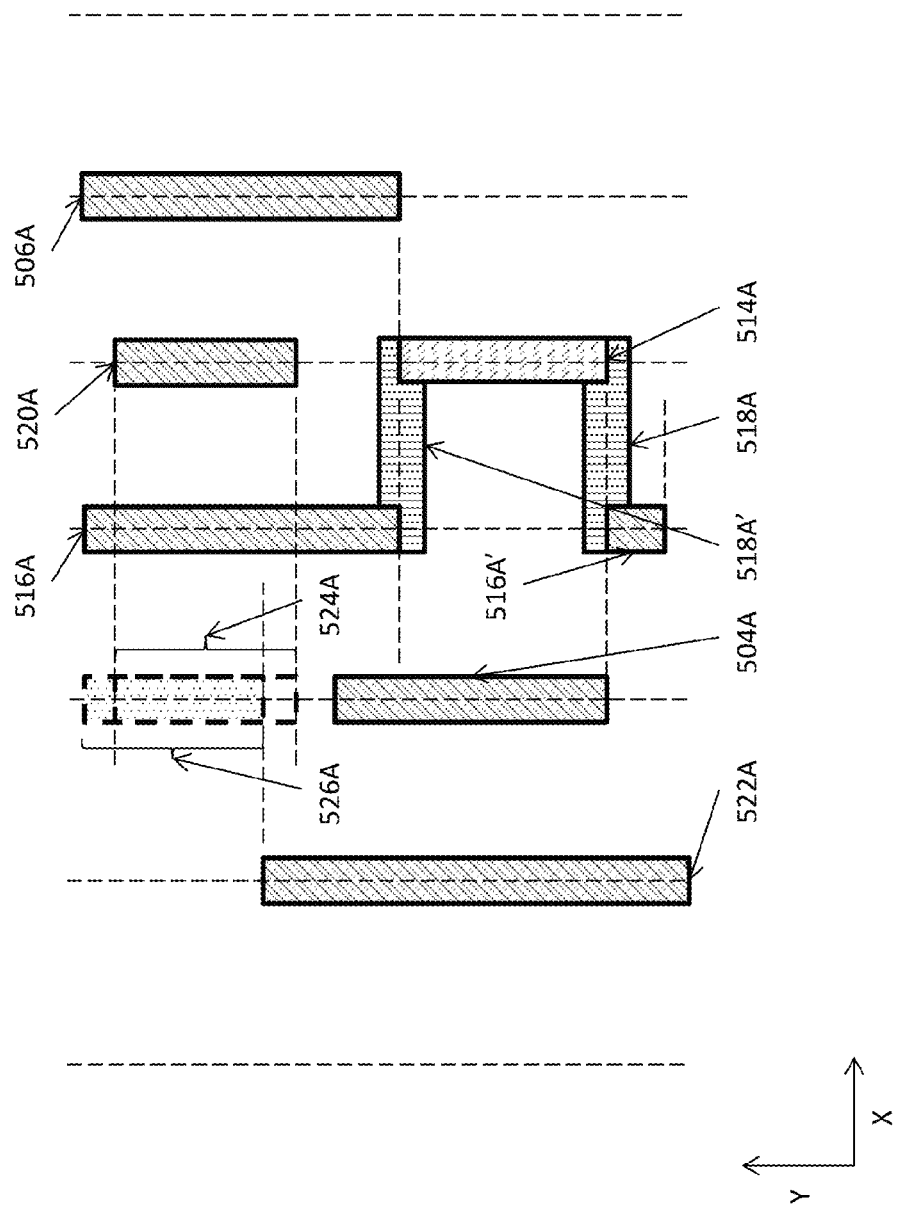

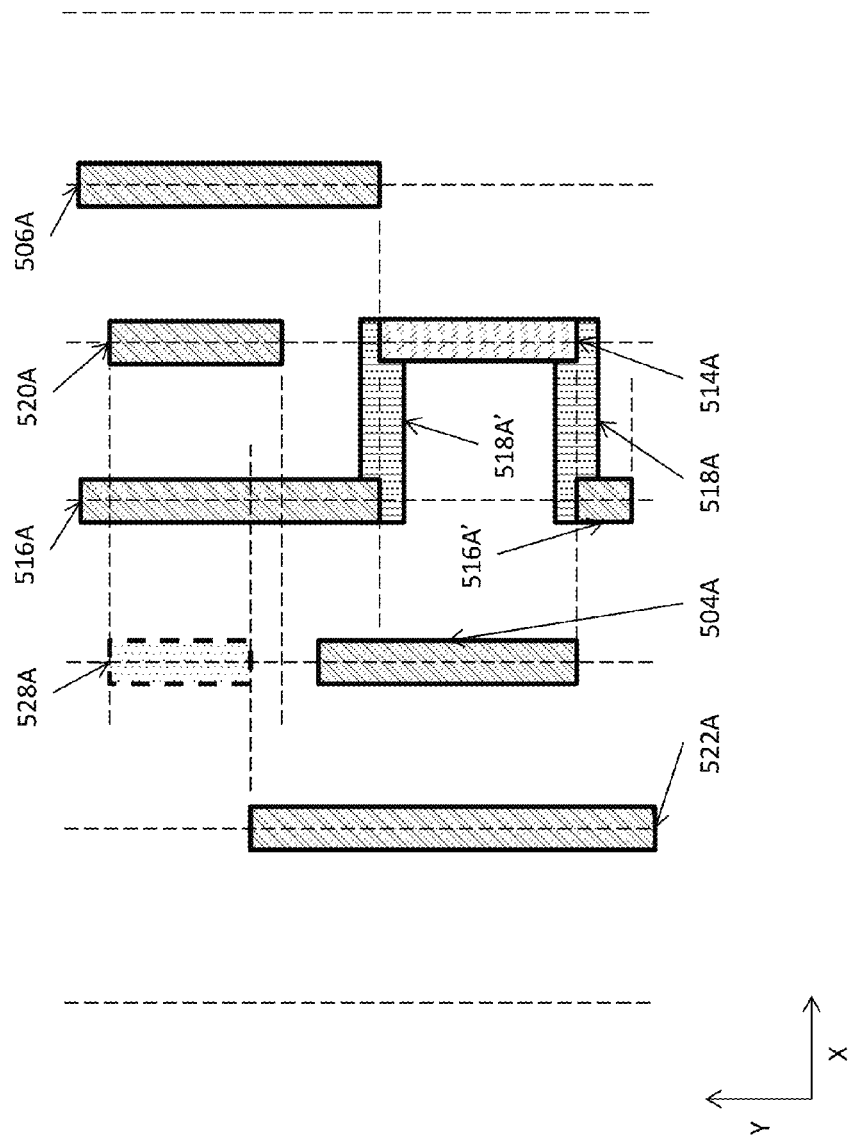

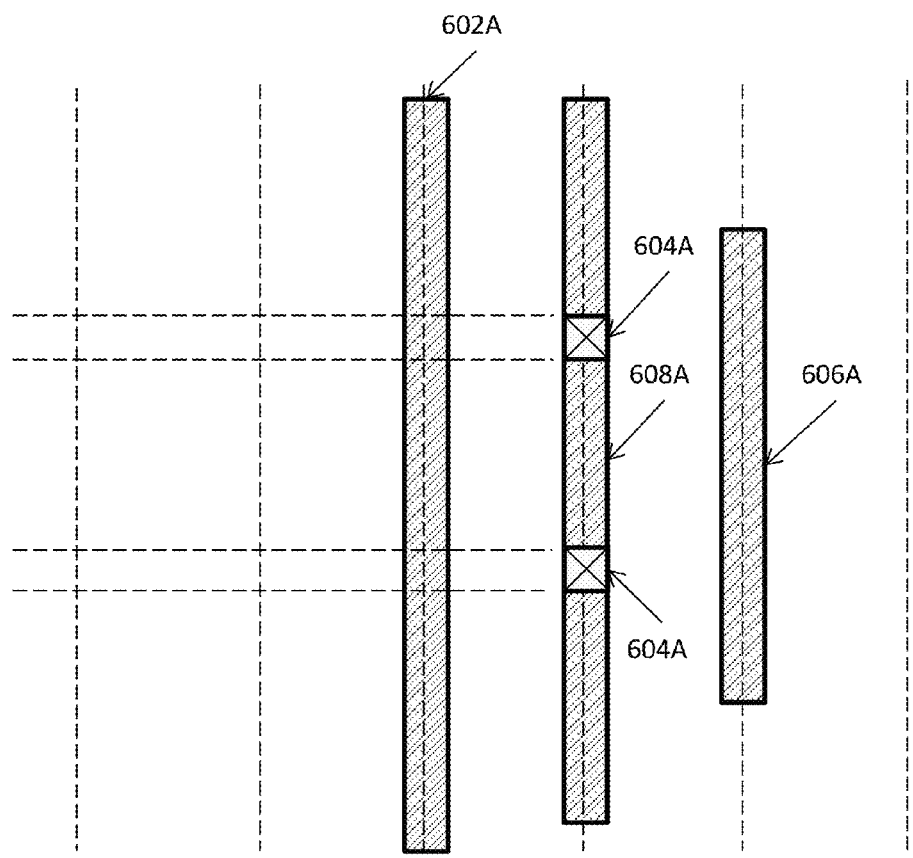
FIG. 6A
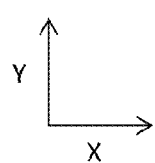

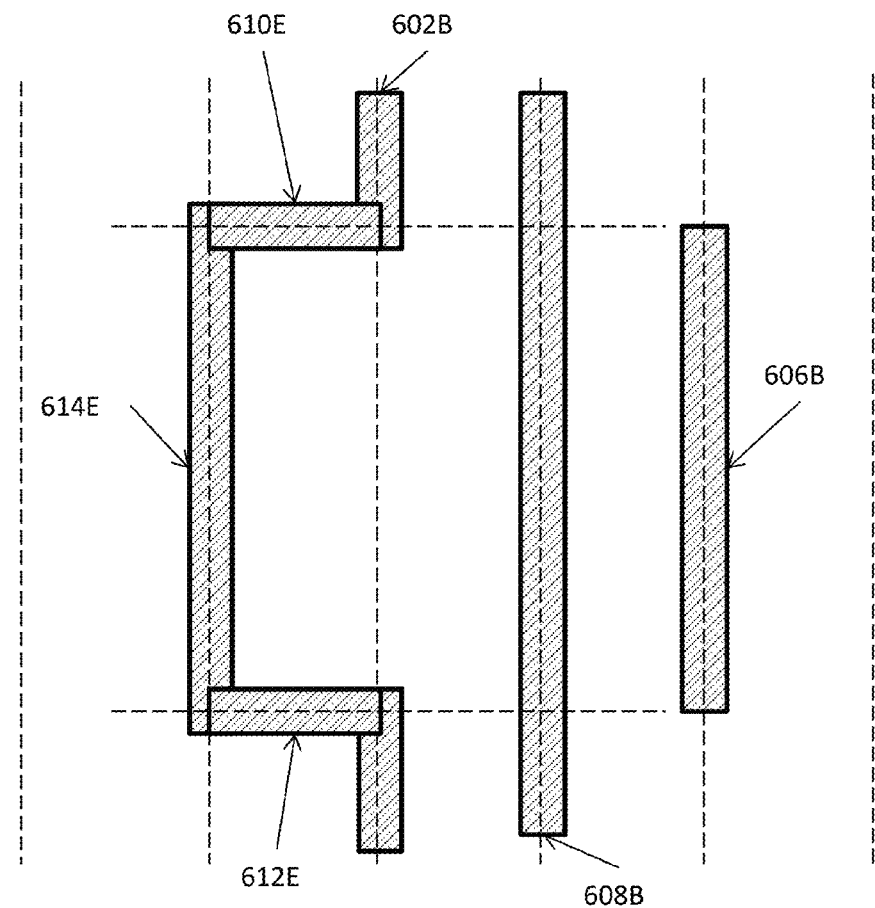
FIG. 6E
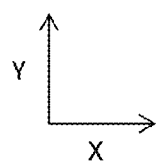

US 9,372,952 B1

METHODS, SYSTEMS, AND ARTICLES OF MANUFACTURE FOR ENHANCING METRICS OF ELECTRONIC DESIGNS USING DESIGN RULE DRIVEN PHYSICAL DESIGN IMPLEMENTATION TECHNIQUES

COPYRIGHT NOTICE

A portion of the disclosure of this patent document includes material, which is subject to copyright protection. The copyright owner has no objection to the facsimile reproduction by anyone of the patent document or the patent disclosure, as it appears in the United States Patent and Trademark Office patent file or records, but otherwise reserves all copyright rights whatsoever.

BACKGROUND

Integrated circuits, or ICs, are created by patterning a substrate and materials deposited on the substrate. The substrate is typically a semiconductor wafer. The patterned features make up devices and interconnections. This process generally starts with a designer creating an integrated circuit by hierarchically defining functional components of the circuit using a hardware description language. From this high-level functional description, a physical circuit implementation dataset is created, which is usually in the form of a netlist. This netlist identifies logic cell instances from a cell library, and describes cell-to-cell connectivity.

Many phases of these electronic design activities may be performed with computer aided design (CAD) tools or electronic design automation (EDA) systems. For example, an integrated circuit designer may use a set of layout EDA application programs, such as a layout editor, to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters. The EDA layout editing tools are often performed interactively so that the designer can review and provide careful control over the details of the electronic design.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. The task of all routers is the same—routers are given some pre-existing polygons consisting of pins on cells and optionally some pre-routes from the placers to create geometries so that all pins assigned to same nets are connected by wires and vias, that all wires and vias assigned to different nets do not overlap, and that all design rules are obeyed. That is, a router fails when two pins on the same net that should be connected are open, when two pins on two different nets that should remain open are shorted, or when some design rules are violated during routing.

A layout file is created from the placement and routing process, which assigns logic cells to physical locations in the device layout and routes their interconnections. The physical layout is typically described as many patterned layers, and the pattern of each layer is described by the union of a set of polygons. The layout data set is stored, for example in GDSII ("Graphic Data System II") or OASIS ("Open Artwork System Interchange Standard") formats. Component devices and interconnections of the integrated circuit are constructed layer by layer. A layer is deposited on the wafer and then it is patterned using a photolithography process and an etch process.

Reducing critical areas and improving yield and performance of electronic design have been some of the ultimate goals and hence challenges in electronic designs. Traditional approaches include various or even iterative analyses (e.g., timing analysis) and repetitive applications multiple DFM (design for manufacturing) techniques at various stages of the electronic design flow. Some traditional approaches further use forward as well as backward annotation techniques to move back and forth between different domains (e.g., schematic domain and physical domain) to communicate various performance characteristics (e.g., timing characteristics) or DFM characteristics. These approaches may also invoke an iterative process to repetitively solve at least a portion of the electronic design of interest multiple times in different domains while hoping to obtain an improved yield or performance characteristics.

Some traditional approaches use a switch box by partitioning an electronic design into a fixed number of switch boxes in each routing direction. For example, these traditional design may subdivide an electronic design into 100 switch boxes in each routing direction and hence have 10,000 switch boxes (100×100) for the electronic design or even 10,000 switch boxes for each routing layer of an electronic design. These approaches may route the electronic design and perform wire spreading by individually examining and processing each switch box. Nonetheless, in these switch-box approaches, the points where interconnects cross the boundaries of switch boxes remain fixed and cannot be moved. As a result, these switch-box approaches necessitate much more jogs due to these fixed points on the boundaries of the switch boxes.

Thus, there exists a need for methods, systems, and articles of manufacture for enhancing metrics of electronic designs using design rule driven physical design implementation techniques.

SUMMARY

Disclosed are method(s), system(s), and article(s) of manufacture for enhancing metrics of electronic designs using design rule driven physical design implementation techniques in one or more embodiments. Various embodiments described herein provide solutions to physical implementation and optimization (collectively physical implementation hereinafter) methodologies for electronic designs with greatly improved runtime, better timing performance, and higher yield. Studies have shown 20-times to 100-times runtime improvement for physical electronic design implementation or post-physical implementation optimization (e.g., post-place and route) of electronic designs.

Some embodiments are directed at a method for enhancing metrics of electronic designs using design rule driven physical design implementation techniques. In these embodiments, the method may include the process of identifying an interconnect and one or more associated design rules, the process of moving at least a portion of the interconnect to an adjacent track by performing a spreading process on a one-dimensional design data of the at least a portion of the interconnect and one or more adjacent shapes. The performance of the spreading process may be based on one or more design rules to determine whether the implemented interconnect including the moved portion provides a DRC clean implementation. Some of these embodiments examine an interconnect in its entirety, rather within the confinement of a fixed region having a prescribed boundary in the layout. The one-dimensional design data provides expedient runtime and may be converted back into two-dimensional form for storage in a standard layout. In some of these embodiments, the original design data of the layout may be pre-processed by using some associated design rules by augmenting various shapes in the layout with one or more respective, associated design rules.

Some other embodiments are directed at a method for physically implementing an electronic design. The method may include the process of iterating through a set of multiple spreading distances to route or modify interconnects in a layout by performing multiple Boolean operations on the interconnect and one or more adjacent shapes. Some of these embodiments may further include the process of determining whether or not the final form of the newly created or modified interconnect comply with various design rules. In addition or in the alternative, the method may include the process of determining the one or more adjacent shapes, upon which some of the multiple Boolean operations are performed, based at least in part upon at least some of the various design rules.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for enhancing metrics of electronic designs using design rule driven physical design implementation techniques are described below with reference to FIGS. 1-9.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 2A illustrates a high-level flow diagram for enhancing metrics of electronic designs using design rule driven physical design implementation techniques in some embodiments.

FIG. 2B illustrates a more detailed flow diagram for enhancing metrics of electronic designs using design rule driven physical design implementation techniques in some embodiments.

FIG. 2C illustrates a more detailed flow diagram for enhancing metrics of electronic designs using design rule driven physical design implementation techniques in some embodiments.

FIG. 2D illustrates a more detailed flow diagram for enhancing metrics of electronic designs using design rule driven physical design implementation techniques in some embodiments.

FIG. 2E illustrates a more detailed flow diagram for enhancing metrics of electronic designs using design rule driven physical design implementation techniques in some embodiments.

FIGS. 5 and 5A-H illustrate the application of an illustrative spreading process with a spreading distance to a portion of an illustrative layout in accordance with some embodiments described herein.

FIGS. 6A-E illustrate an evolution of some illustrative implementations of a portion of an electronic design by using some methodologies described herein in some embodiments.

DETAILED DESCRIPTION

Figure 1:
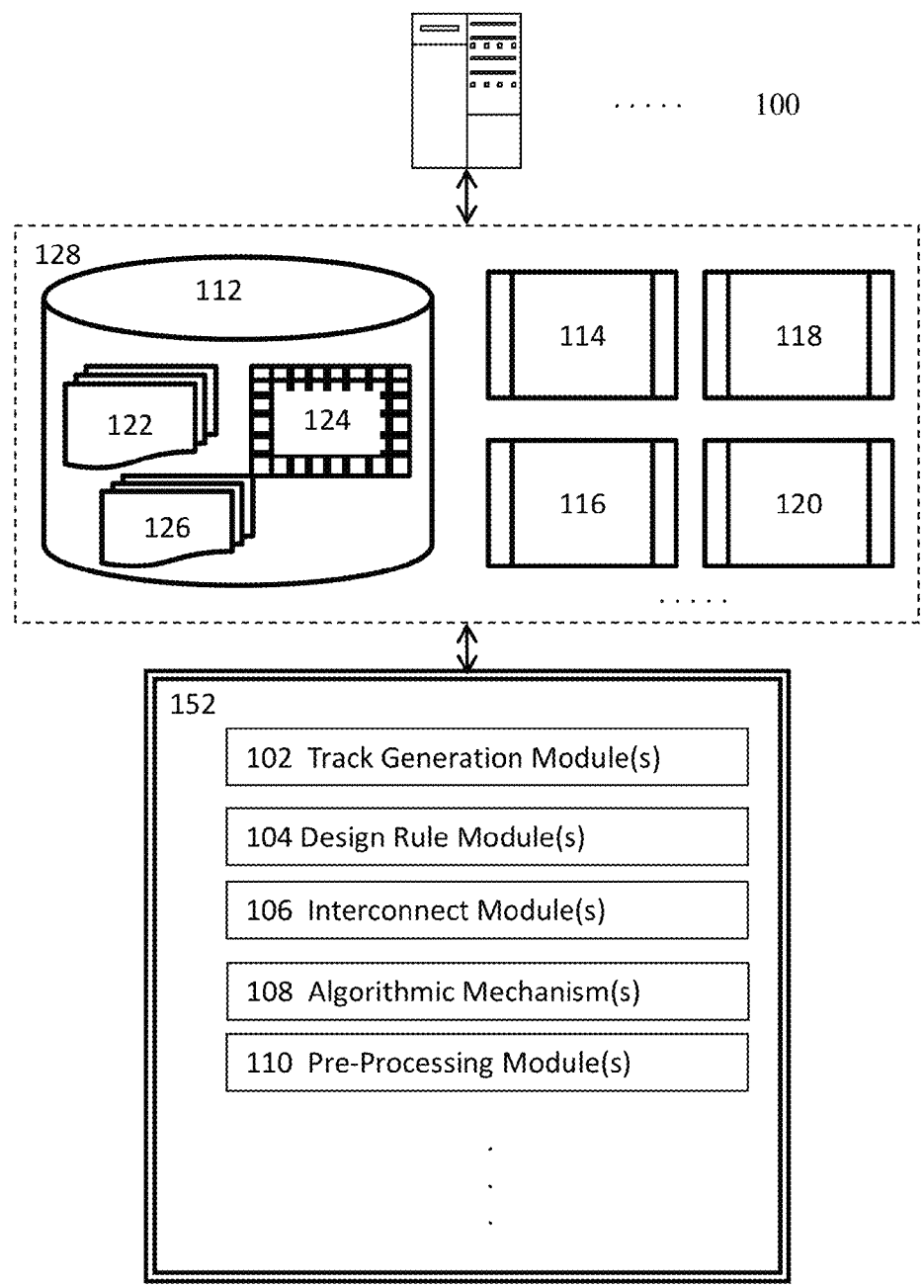
FIG. 1 illustrates a high level block diagram for a system for enhancing metrics of electronic designs using design rule driven physical design implementation techniques in some embodiments.

Various embodiments of the invention are directed to a methods, systems, and articles of manufacture for enhancing metrics of electronic designs using design rule driven physical design implementation techniques. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are method(s), system(s), and article(s) of manufacture for enhancing metrics of electronic designs using design rule driven physical design implementation techniques in one or more embodiments. Some embodiments are directed at a method that includes the process of identifying an interconnect and one or more associated design rules, the process of moving at least a portion of the interconnect to an adjacent track by performing a spreading process on a one-dimensional design data of the at least a portion of the interconnect and one or more adjacent shapes.

The performance of the spreading process may be based on one or more design rules to determine whether the implemented interconnect including the moved portion provides a DRC clean implementation. One advantage of some embodiments is that by spreading at least some interconnects (either during routing or during post-route optimization) in an electronic design, the cross-coupling between interconnects is reduced. The reduction in the cross-coupling between interconnects reduces the electrical parasitics (e.g., coupling-capacitance, etc.) and thus improves the timing performance and yield of electronic designs. Some of these embodiments examine an interconnect in its entirety, rather within the confinement of a fixed region having a prescribed boundary in the layout. The one-dimensional design data provides expedient runtime and may be converted back into two-dimensional form for storage in a standard layout. In some of these embodiments, the original design data of the layout may be pre-processed by using some associated design rules by augmenting various shapes in the layout with one or more respective, associated design rules.

Some other embodiments iterate through a set of multiple spreading distances to route or modify interconnects in a layout by performing multiple Boolean operations on the interconnect and one or more adjacent shapes. Some of these embodiments may further determine whether or not the final form of the newly created or modified interconnect comply with various design rules. In addition or in the alternative, the one or more adjacent shapes, upon which some of the multiple Boolean operations are performed, may be determined based at least in part upon at least some of the various design rules.

FIG. 1 illustrates a high level block diagram for a system 100 for enhancing metrics of electronic designs using design rule driven physical design implementation techniques in some embodiments. In one or more embodiments, the system for enhancing metrics of electronic designs using design rule driven physical design implementation techniques may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine and/or a detail routing engine 114, a layout editor 116, a design rule checker 118 that may work individually, separately from or in conjunction with other modules, one or more verification engines 120, a floorplanner, etc. The one or more computing systems 100 may further write to and read from a local or remote volatile or non-volatile computer accessible storage medium 112 that stores thereupon data or information such as, but not limited to, one or more databases (124) such as schematic design database(s) or physical design database(s), libraries, data, rule decks for design rules, constraints, requirements, etc. (122), or other information or data (126) that may be used to facilitate the performance of various functions to achieve the intended purposes.

In some embodiments, the one or more computing systems 100 may, either directly or indirectly through various resources 128 to invoke various software, hardware modules or combinations thereof 152 that may comprise track generation module(s) 102 to, for example, create one or more tracks, label a plurality of track patterns, to associate one or more rules or requirements with a track or multiple tracks, etc., one or more design rule modules 104 to, for example, create or store a set of design rules for an electronic design working in conjunction with the design rule checker 118, one or more interconnect modules 106 to create, move, or fix interconnects (e.g., wires, pins, terminals, pads, vias, nets, or a portion thereof, etc.), etc., one or more algorithmic mechanisms 108 to perform various algorithmic operations upon a part of an electronic design in conjunction with a physical implementation tool, one or more analysis or determination modules to perform various analyses or determinations such as constraint analysis (e.g., interactive constraint analysis), or to make various determinations either in an offline mode while the electronic design implementation process is halted or stopped or in an online mode while the electronic design is being implemented. The one or more analysis or determination modules may further communicate its analysis or determination results to other tools, modules, or processes to guide the electronic design process. In some embodiments, the one or more computing systems 100 may, either directly or indirectly through various resources 128 to invoke various software, hardware modules or combinations thereof 152 that may comprise a pre-processing module 110 to pre-process the data of various design components in an electronic design. More details about the pre-processing module 110 will be described below with reference to FIG. 2D.

For example, the method or system may interactively check whether an electronic design complies with various constraints or design rules (collectively constraints), such as some net-based spacing constraints that impose some limitations on the spacing between two nets, in a nearly real-time manner while the electronic design is being created in some embodiments. In these embodiments, the disclosed method or system uses the connectivity information provided by a connectivity engine or assigned by a designer to present feedback to a user as to whether a newly created object or a newly modified object complies or violates certain relevant constraints in an interactive manner or in nearly real-time without having to perform such constraints checking in batch mode. More details about the aforementioned modules will become clear and self-explanatory in the remainder of the description with reference to various other drawing figures.

Each of these modules in 152 may individually perform its intended functions or may function either alone or in conjunction with one or more other modules. For example, a physical implementation module 104 may work in conjunction with a spacetile manipulation module 106 and a track pattern manipulation module 102 to create a set of spacetiles, identify a set of spacetile tiles based at least in part upon the track patterns and/or some track requirements (e.g., on-track requirements for certain wires, etc.), identify a search probe, and then use the search probe to perform area-based search to identify or determine a viable routing solution for a particular segment of wire or a set of wires to be implemented in at least a part of an electronic designs.

A module or process described herein may be performed separately from one or more other modules or processes or may be performed simultaneously with one or more modules or processes. For example, the design rule checker 118 may individually, separately perform design rules checks or may reside in, for example, the physical design environment to monitor the implementation of an electronic design while the electronic design is being implemented using the physical design tools (e.g., global routing engine and/or a detail routing engine 114, a layout editor 116). In this example, the design rule checker 118 may further forward the generated results to various other tools (e.g., the physical design implementation tools described above) to guide the physical implementation of the electronic design.

Figure 2A:
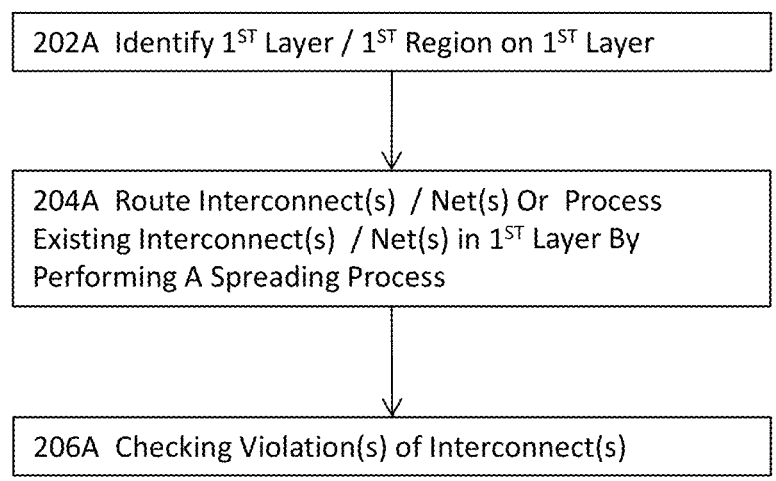
FIGS. 2A-E illustrate flow diagrams for enhancing metrics of electronic designs using design rule driven physical design implementation techniques in some embodiments.

FIGS. 2A-E illustrate flow diagrams for enhancing metrics of electronic designs using design rule driven physical design implementation techniques in some embodiments. FIG. 2A illustrates a high-level flow diagram for enhancing metrics of electronic designs using design rule driven physical design implementation techniques in some embodiments. In some embodiments illustrated in FIG. 2A, the method or system for enhancing metrics of electronic designs using design rule driven physical design implementation techniques may comprise the respective process or module 202A of identifying a first layer or a first region on a first layer of an electronic design. In some of these embodiments, a layer includes a routing layer or a metal layer in a stack of semiconductor layers forming an electronic circuit.

Process or module 202A may identify an entire layer in some embodiments or one or more portions of a layer in some other embodiments. For example, process or module 202A may identify the entire second metal layer, a tracked portion on the second metal layer, or a tracked portion and a trackless portion of an electronic design in some embodiments. A track (or a routing track) includes an imaginary line or an imaginary line segment that has no width and is non-physical in the design but may be used by a physical implementation tool (e.g., a router) to guide the physical implementation tool to find a implementation solution. Although a track does not have a width, a track may nonetheless be associated with a rule that requires or desires the track to be used to implement a wire having specific width value(s). A track may be identified from the manufacturing grids provided by the manufacturer of electronic designs (e.g., foundries) and typically comprising two orthogonal sets of parallel lines with a pitch value of a few angstroms.

Nonetheless, it shall be noted that some embodiments do or do not necessarily require tracks. The method or the system may create the "tracks" on the fly or on demand in some embodiments. The method or system may use the "tracks" for locating design components in an electronic design in some other embodiments. In some other embodiments, the method or the system may use the track to lay the centerline of an interconnect during, for example, the routing process. For example, a router may lay the centerline of a wire along a track on which the router determines that a viable routing solution is found. A track may also belong to a track pattern having one or more pitch values between two neighboring tracks in these embodiments. In these embodiments illustrated in FIG. 2A, the method or system may comprise the respective process or module 204A of routing one or more interconnects or nets or processing one or more existing interconnects or nets on the first layer by performing a spreading process. The spreading process will be described in greater details in subsequent paragraphs with reference to FIGS. 3-8. Moreover, the method or system may also comprise the respective process or module 206A of determining whether the one or more newly created interconnects or nets or the one or more existing interconnects or nets violate any rules, requirements, or constraints (collectively design rules hereinafter). In some embodiments, process or module 206A may be performed or invoked separately from other processes or modules to check a partially implemented electronic design in a batch mode while the implementation tools are idle. In some other embodiments, process or module 206A may be performed or invoked during the implementation of the electronic design to provide nearly real-time feedback to various other processes or modules described herein to guide these various other processes or modules in better performing their intended functions and better serving their intended purposes. It shall be noted that process or module 206A may provide the feedback to other processes or modules as soon as those results are determined or generated, and the generation or determination of these results may trigger one or more processes or may invoke one or more modules to perform various functions in order to forward or provide these results to other processes or modules, and that the triggering of the one or more processes, the invocation of various modules, or even storing these results in one or more non-transitory computer accessible media may take certain time to complete. As a result, process or module 206A may be performed or invoked during the implementation of the electronic design to provide nearly real-time feedback to various other processes or modules.

Figure 2B:
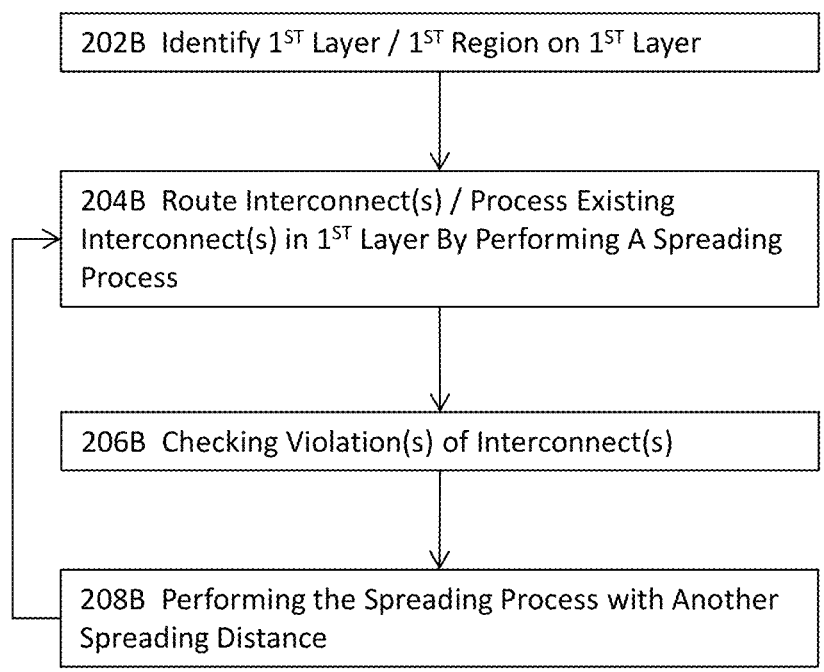

FIG. 2B illustrates a more detailed flow diagram for enhancing metrics of electronic designs using design rule driven physical design implementation techniques in some embodiments. In some embodiments illustrated in FIG. 2B, the method or system for enhancing metrics of electronic designs using design rule driven physical design implementation techniques may comprise the respective process or module 202B of identifying a first layer in substantially similar manners as those described for FIG. 2A above. The method or system may further include the respective process or module 204B for routing one or more interconnects or nets or processing one or more existing interconnects or nets on the first layer by performing a spreading process in substantially similar manners as those described for FIG. 2A.

Moreover, method or system may further include the respective process or module 206B for determining whether the one or more newly created interconnects or nets or the one or more existing interconnects or nets violate any design rules in substantially similar manners as those described for FIG. 2A. In some embodiments illustrated in FIG. 2B, the method or the system may further the respective process or module 208B for performing the spreading process with another spreading distance. In these embodiments, the method or the system may then return back to 204B to further physically implement the one or more interconnects or nets one or more existing interconnects or nets and repeat 204B through 208B until a stopping criterion is reached.

In some embodiments, the stopping criterion includes the scenario where all the available spreading distances have been exhausted. In some embodiments, the stopping criterion includes the scenario where no violations exist after all interconnects or nets have been implemented. A spreading distance comprises a distance or a spacing value used to route an interconnect segment at the distance or spacing value from the original interconnect segment to create a jog or bend or to move an existing interconnect segment from its original location by the distance or spacing value in some embodiments.

Figure 2C:
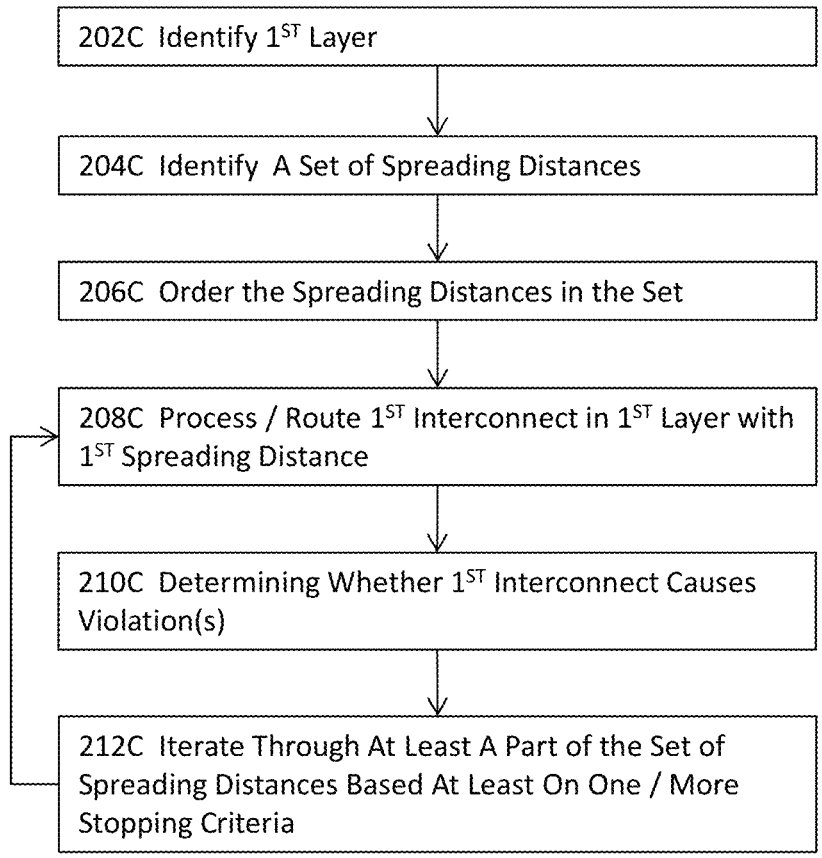

FIG. 2C illustrates a more detailed flow diagram for enhancing metrics of electronic designs using design rule driven physical design implementation techniques in some embodiments. In some embodiments illustrated in FIG. 2C, the method or system for enhancing metrics of electronic designs using design rule driven physical design implementation techniques may comprise the respective process or module 202C of identifying a first layer in substantially similar manners as those described for FIGS. 2A-B above. The method or system may further include the respective process or module 204C for identifying a set of spreading distances. For example, the method may identify the set of spreading distances as {3-pitch, 2-pitch, 1-pitch, ½-pitch, ¼-pitch} in either direction in some embodiments. In these embodiments, the method or the system's using a fraction of a pitch as a spreading distance demonstrates their capability of working on trackless designs in some embodiments. In some other embodiments, a spreading distance needs not necessarily be a rational number multiple of a pitch or based on a pitch value so long as a spreading distance includes an integer multiple of the manufacturing grid spacing provided by semiconductor foundries. For example, a spreading distance may include an irrational number multiple of a pitch (e.g., 0.16-pitch) or even a real number distance (e.g., 50-nanometer) including all rational and irrational numbers.

In addition, the method or the system may further include the respective process or module 206C for ordering the spreading distances in either the ascending or descending order in the set identified at 204C. The method or system may further include the respective process or module 208C for routing one or more interconnects or nets or processing one or more existing interconnects or nets on the first layer by performing a spreading process in substantially similar manners as those described for FIGS. 2A-B. In some of these embodiments illustrated in FIG. 2C, the method or the system does not merely examine only a smaller portion of an interconnect or net in processing or routing the interconnect or the net. Rather, the method or the system examines the entire interconnect as well as the contextual information for the entire interconnect in processing or routing the interconnect or the net.

In these embodiments, the method or the system implements an interconnect or net from its source to destination without making any unnecessary jogs or bends at the boundaries of some artificially created regions such as a switch box which may be referred to as a routing box in some cases. Some conventional approaches artificially create multiple switch boxes (e.g., 100 switch boxes in each direction) to sub-divide a layer of an electronic design (e.g., 10,000 switch boxes with 100 sub-divisions in each direction). One of the advantages of various embodiments described herein over the conventional switch box is that various embodiments examines the entire interconnect segment, an entire interconnect, or even an entire net, instead of merely the smaller region (e.g., a switch box or a routing box) that is being implemented, and that the internet or net is not bound by certain fixed points along the boundary of these regions (e.g., switch boxes or routing boxes). For example, a horizontal row of switch boxes to accommodate a horizontal interconnect or net often require a point on a common boundary of two immediately neighboring switch boxes be fixed. Therefore, if the interconnect includes a Z-bend in a switch box, the interconnect must include another, necessary bend (e.g., another Z-bend or an L-bend) after the Z-bend such that the interconnect can meet the fixed boundary point that is fixed along one direction (e.g., having the same horizontal coordinate or the same vertical coordinate). Various embodiments eliminate such bends or jogs necessitated by the requirements of fixed boundary points in these conventional approaches. In some of these embodiments, the method or the system may further include the respective process or module 210C of determining whether the one or more newly created interconnects or nets or the one or more existing interconnects or nets violate any design rules in substantially similar manners as those described for FIG. 2A-B. In some of these embodiments, the method or the system may further include the respective process or module 212C of iterating through at least a part of the set of spread distances. In some of these embodiments, process or module 212C iterates through at least a part of the set of spread distances based at least in part upon a stopping criterion. In some embodiments, the stopping criterion includes the scenario where all the available spreading distances have been exhausted. In some embodiments, the stopping criterion includes the scenario where no violations exist after all interconnects or nets have been implemented.

Figure 2D:
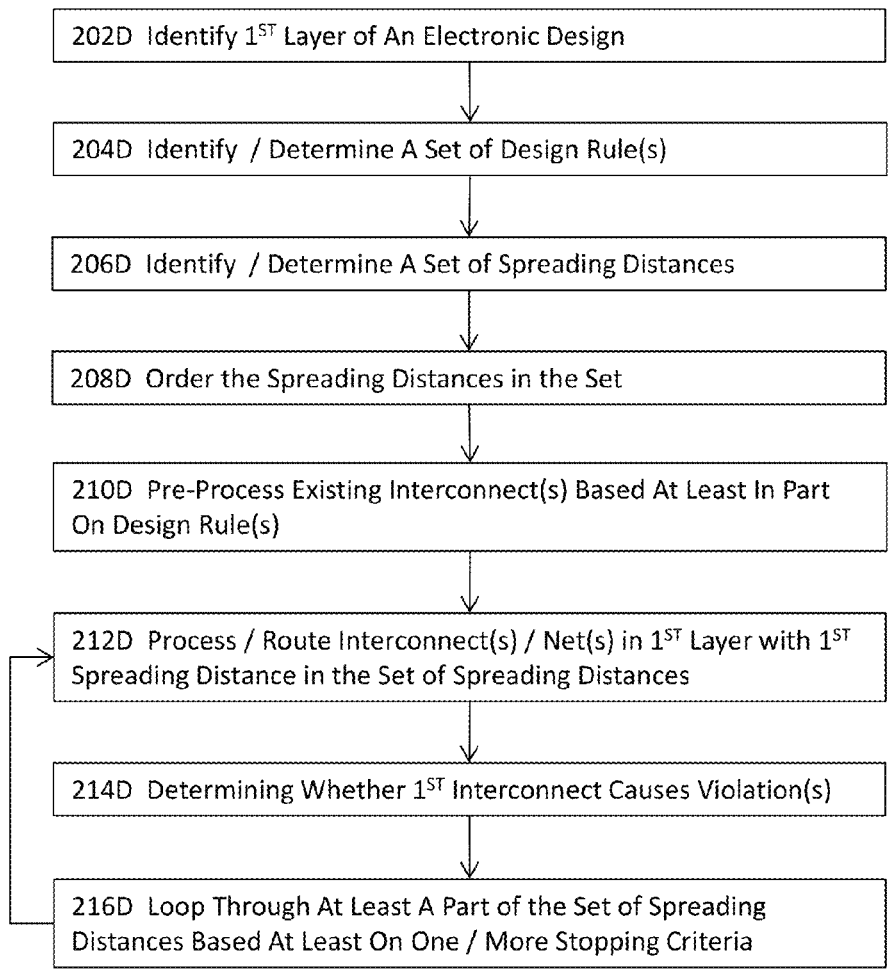

FIG. 2D illustrates a more detailed flow diagram for enhancing metrics of electronic designs using design rule driven physical design implementation techniques in some embodiments. In some embodiments illustrated in FIG. 2D, the method or system for enhancing metrics of electronic designs using design rule driven physical design implementation techniques may comprise the respective process or module 202D of identifying a first layer in substantially similar manners as those described for FIGS. 2A-C above. Moreover, the method or system may further comprise the respective process or module 204D of identifying a set of one or more design rules with which the electronic design is to comply in some embodiments.

In some of these embodiments, the set of one or more design rules may include, for example but not limited to, one or more spacing rules governing the spacing between two opposing edges or corners of two components, one or more width rules governing the widths of interconnects or other components, one or more parallel run length rules governing the spacing between two parallel interconnects based on the lengths of these two interconnects that are in parallel with each other, one or more via enclosure rules governing the enclosure spacing values for vias, one or more via cut size rules controlling the cut sizes of vias, one or more layer- or region-specific on-track requirements governing all routes in the region or the layer must coincide with tracks, one or more rules governing whether or not wrong-way routing is permitted, and one or more negative rules, or any other applicable rules governing the physical implementation of electronic designs. In some embodiments, the one or more negative rules include one or more enclosure edge rules governing the arrangements of interconnects immediately adjacent to a via, one or more opposite edge spacing rules controlling the arrangement or design of two immediately neighboring interconnects on both sides of an interconnect, etc.

In some embodiments, the method or system may further comprise the respective process or module 206D of identifying or determining a set of spreading distances in substantially similar or identical manners as those described for 204C of FIG. 2C. A spreading distance comprises a distance or a spacing value used to route an interconnect segment at the distance or spacing value from the original interconnect segment to create a jog or bend or to move an existing interconnect segment from its original location by the distance or spacing value in some embodiments. In some embodiments, the method or system may further comprise the respective process or module 208D of ordering the spreading distances in either the ascending or descending order in the set identified at 206D in substantially similar or identical manners as those described for 204b of FIG. 2C.

In some embodiments, the method or system may further comprise the respective process or module 210D of pre-processing one or more existing interconnects or one or more interconnects to be newly created based at least in part upon at least some of the set of one or more design rules identified or determined at 204D. In some of these embodiments, process or module 210D augment the one or more existing interconnects or one or more interconnects to be newly created by at least some of the set of one or more design rules. For example, process or module 210D may augment an interconnect (existing or to be newly created) by the width rule governing the interconnect (e.g., a fat wire for the power bus of a wider width or a default-width wire of a standard width) before performing the spreading process or the routing process to implement the interconnect.

As another example, process or module 210D may augment an interconnect (existing or to be newly created) by the spacing rule governing the interconnect to augment the space to be occupied by the interconnect before performing the spreading process or the routing process to implement the interconnect. In these embodiments, augmenting an interconnect by at least some of the set of one or more design rules before processing the interconnect ensure the compliance of the interconnect with the at least some of the set of one or more design rules when the interconnect is finally processed by the spreading process or the physical implementation tool.

In addition or in the alternative, process or module 210D may further pre-process at least some of the existing interconnects to transform the two-dimensional shapes (e.g., polygons) of the at least some existing interconnects into one-dimensional geometric entities (e.g., line segments) by transforming the corner coordinates into the end coordinates (e.g., X-coordinates for a horizontal interconnect and Y-coordinates for a vertical interconnect). It shall be noted that various figures include the X-Y coordinate system that is inserted into these figures for reference purposes but are not intended to limit the scope of the embodiments illustrated in these figures or other embodiments covered by applying various techniques described herein as such. An illustrative data structure for storing the one-dimensional geometric data may include a data structure, a database, a table, or a list (collectively data structure hereinafter) where each row corresponds to, for example, a track, and each pair of numbers in a row corresponds to the starting coordinate and ending coordinate of an interconnect segment.

In some embodiments, the method or system may further comprise the respective process or module 212D of processing or routing an interconnect or a net in the first layer with the first spreading distance in the set of spreading distances identified at 206D. More details about processing or routing an interconnect or a net with a spreading distance will be provided in paragraphs below with reference to FIGS. 3-8. In some embodiments, the method or system may further comprise the respective process or module 214D of determining whether the interconnect or the net processed or routed at 212D violates one or more design rules in substantially similar or identical manners as those described for 206A in FIG. 2A.

In some embodiments, the method or system may further comprise the respective process or module 216D of looping through at least some of the set of spreading distances identified or determined at 206D and repeating the processes or the execution of modules 212D through 216D until one or more stopping criteria are met. For example, if an interconnect or net processed or routed with the first spreading distance violates a design rule, process or module 216D may process or route the interconnect with a second spreading distance and repeat 212D and 214D to determine whether the first interconnect or net violates one or more design rules. In some embodiments, the stopping criterion includes the scenario where all the available spreading distances have been exhausted. In some embodiments, the stopping criterion includes the scenario where no violations exist after all interconnects or nets have been implemented.

Figure 2E:
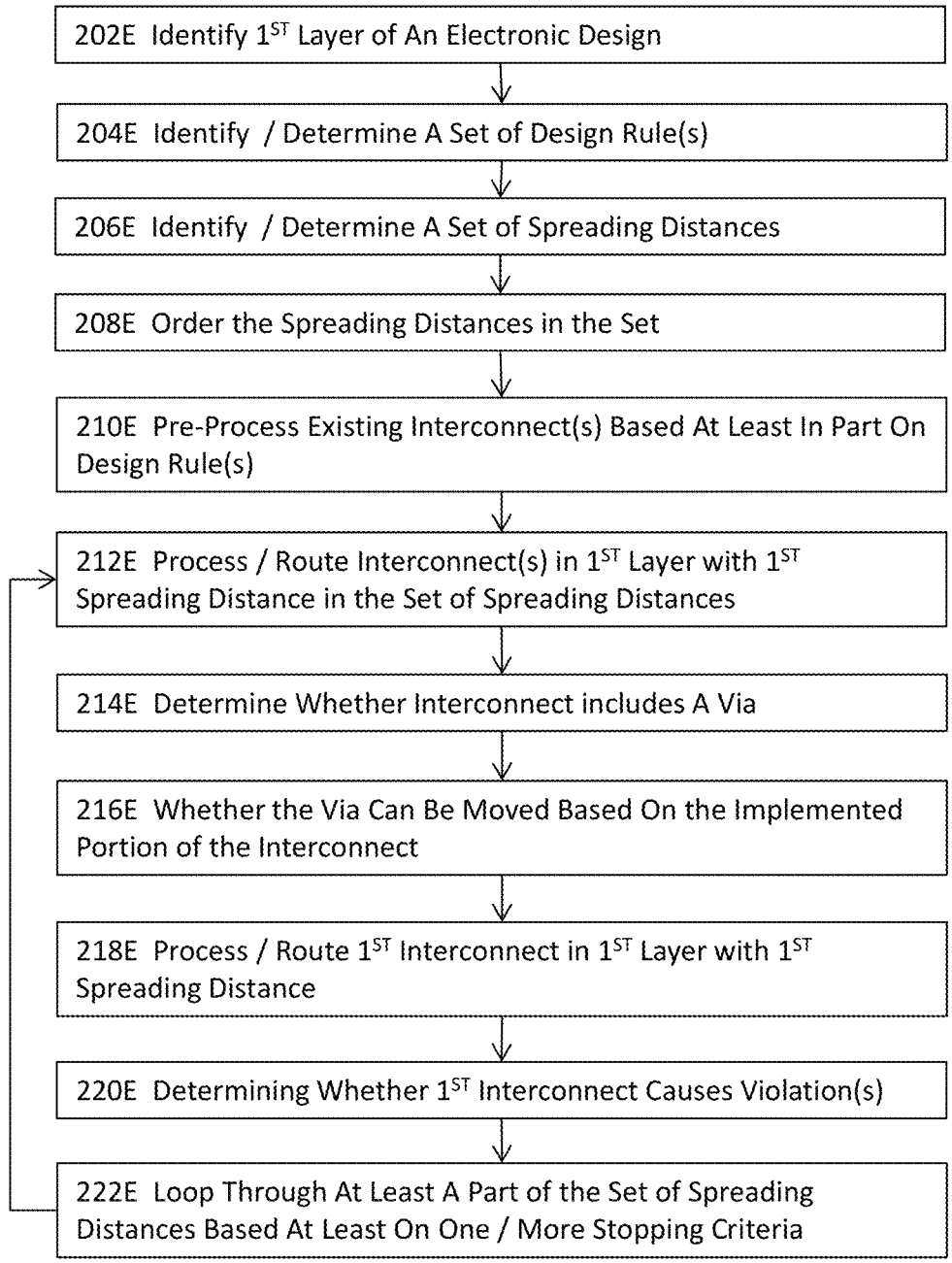

FIG. 2E illustrates a more detailed flow diagram for enhancing metrics of electronic designs using design rule driven physical design implementation techniques in some embodiments. In some embodiments illustrated in FIG. 2E, the method or system for enhancing metrics of electronic designs using design rule driven physical design implementation techniques may comprise the respective process or module 202E of identifying a first layer in substantially similar or identical manners as those described for FIGS. 2A-D above. Moreover, the method or system may further comprise the respective process or module 204E of identifying a set of one or more design rules with which the electronic design is to comply in some embodiments in substantially similar or identical manners as those described for FIGS. 2A-D above.

In some embodiments, the method or system may further comprise the respective process or module 206E of identifying or determining a set of spreading distances in substantially similar or identical manners as those described for 204C of FIG. 2C or 204D of FIG. 2D. In some embodiments, the method or system may further comprise the respective process or module 208E of ordering the spreading distances in either the ascending or descending order in the set identified at 206E in substantially similar or identical manners as those described for 204C of FIG. 2C or 208D of FIG. 2D. In some embodiments, the method or system may further comprise the respective process or module 210E of pre-processing one or more existing interconnects or one or more interconnects to be newly created based at least in part upon at least some of the set of one or more design rules identified or determined at 204E in substantially similar or identical manners as those described for 210D of FIG. 2D.

In some embodiments, the method or system may further comprise the respective process or module 212E of processing or routing an interconnect or a net in the first layer with the first spreading distance in the set of spreading distances identified at 206D. More details about processing or routing an interconnect or a net with a spreading distance will be provided in paragraphs below with reference to FIGS. 3-8. In some embodiments, the method or system may further comprise the respective process or module 214E of determining whether or not the interconnect or net includes a via along the interconnect for jumping to one or more adjacent layers. In some embodiments, the method or system may further comprise the respective process or module 216E of determining whether or not the via can be moved to another location. In some of these embodiments, process or module 216E may determine whether the via may be moved based at least in part upon an implemented portion of the interconnect of interest.

For example, if the interconnect including a via, and the interconnect segment leading to the via is moved to another location, whether or not the via may be moved will determine whether or not the via may be moved along with the moved interconnect segment. In some embodiments, the method or system may further comprise the respective process or module 218E of process or routing the interconnect or net based at least in part upon the determination of whether or not the via may be moved. In some embodiments, the method or system may further comprise the respective process or module 220E of determining whether the interconnect or the net processed or routed at 218E violates one or more design rules in substantially similar or identical manners as those described for 206A in FIG. 2A or 214D of FIG. 2D. In some embodiments, the method or system may further comprise the respective process or module 222E of looping through at least some of the set of spreading distances identified or determined at 206E and repeating the processes or the execution of modules 212E through 222E until one or more stopping criteria are met in substantially similar or identical manners as those described for 216D of FIG. 2D.

Figure 3:
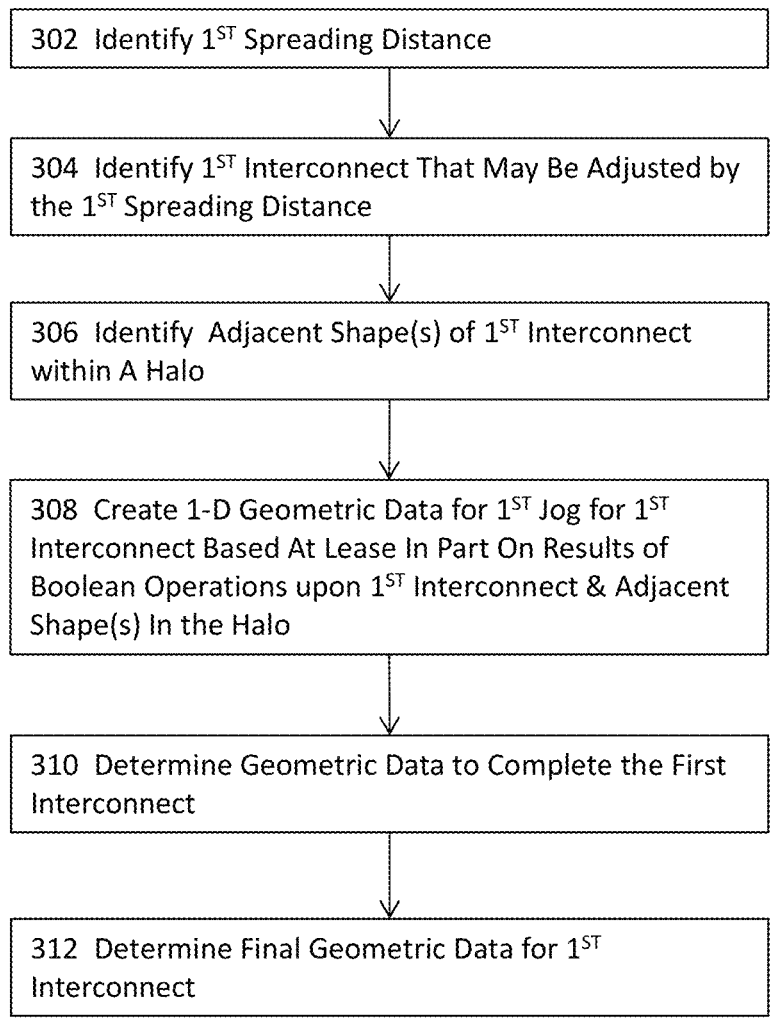
FIG. 3 illustrates a illustrative flow diagram for enhancing metrics of electronic designs using design rule driven physical design implementation techniques in some embodiments.

FIG. 3 illustrates a illustrative flow diagram for enhancing metrics of electronic designs using design rule driven physical design implementation techniques in some embodiments. In some of the embodiments illustrated in FIG. 3E, the method or system may comprise the respective process or module 302 of identifying a first spreading distance. In addition, the method or system may comprise the respective process or module 304 of identifying a first interconnect that may be adjusted by using the first spreading distance. Not all interconnects may be adjusted by the same spreading distance. For example, some interconnects or portions thereof may be adjusted by a three-pitch spreading distance, some by a two-pitch spreading distance, and some by only a fraction of a pitch.

In some embodiments, the method or system may comprise the respective process or module 306 of identifying one or more adjacent shapes of the first interconnect within a halo around from the first interconnect. In some embodiments, a halo may be defined based at least in part upon the first spreading distance. For example, if the first spreading distance is two-pitches, a halo may be defined as an area centered around the location for the moved segment with one or more predetermined distances on at least both sides or all for sides in the direction along the interconnect. In some embodiments, the method or system may comprise the respective process or module 308 of creating the one-dimensional geometric data for a first jog for the first interconnect by using one or more Boolean operations that operate upon at least a portion of the first interconnect and one or more adjacent shapes within the halo.

In some embodiments, the method or system may comprise the respective process or module 310 of determining the geometric data to complete. In some embodiments, the geometric data include intermediate geometric results or data during performance of some of the Boolean operations. For example, the geometric data may include the intermediate results of performing Boolean operations on the first interconnect and the one or more shapes within the halo on one side of the first interconnect without performing Boolean operations on the first interconnect and the one or more other shapes within the halo on the other side of the first interconnect. In some embodiments, the method or system may comprise the respective process or module 312 of determining the final geometric data for the first interconnect. The method or the system may further transform the one-dimensional geometric data of the final shape of the first interconnect back into the two-dimensional geometric data.

Figure 4:
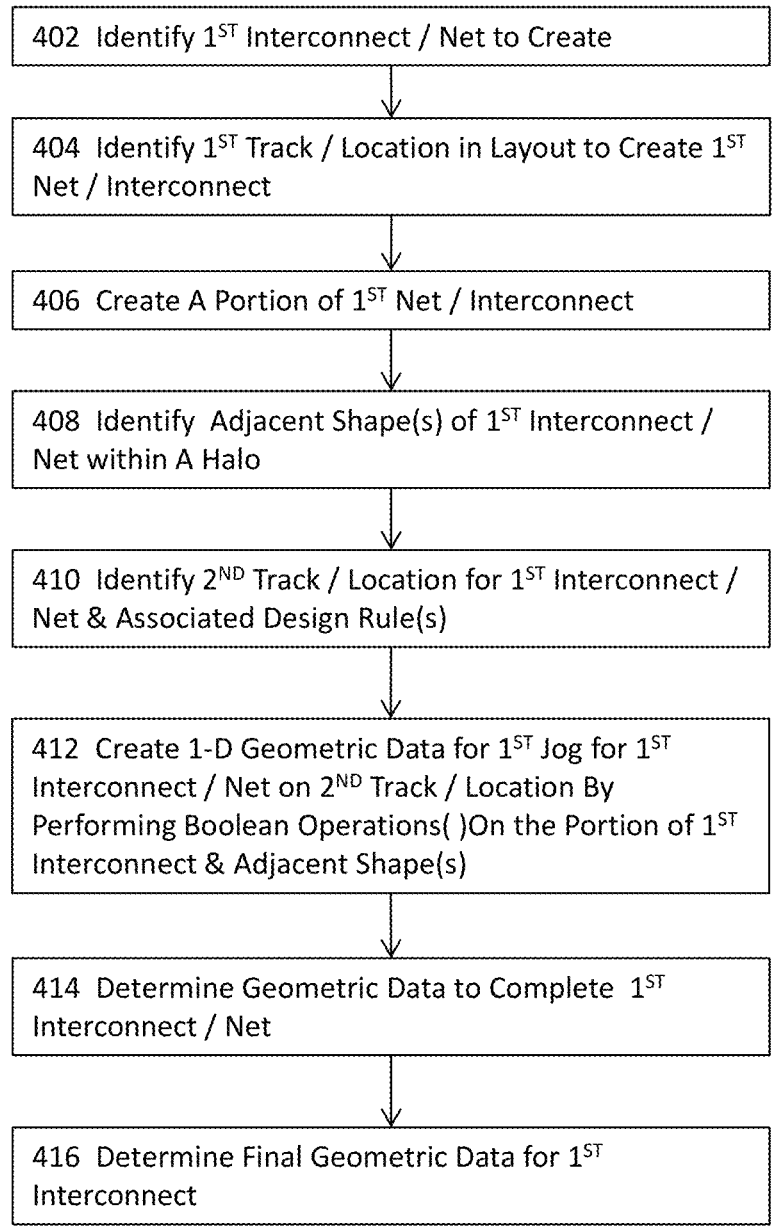
FIG. 4 illustrates another flow diagram for enhancing metrics of electronic designs using design rule driven physical design implementation techniques in some embodiments.

FIG. 4 illustrates another flow diagram for enhancing metrics of electronic designs using design rule driven physical design implementation techniques in some embodiments. In some of the embodiments illustrated in FIG. 4, the method or system may comprise the respective process or module 402 of identifying a first interconnect or net to create or route. In some embodiments, the method or system may comprise the respective process or module 404 of identifying a first track or location in the layout of an electronic design to create or route the first interconnect. For example, process or module 404 may use the source to identify a track that intersects the source of the interconnect. In some cases where no tracks intersect a source (e.g., a pin, a terminal, a pad, a port, etc.), process or module 404 may create an imaginary line or identify a manufacturing grid line to physically implement the interconnect along the imaginary line or the manufacturing grid line.

In these latter embodiments, the method or system does not need a tracked design in order for various processes or modules described herein in order to achieve their intended purposes or to perform their respective functionalities. In some embodiments, the method or system may comprise the respective process or module 406 of creating a portion of the first interconnect or net. For example, process or module 406 may invoke a routing engine (e.g., the global routing engine and/or a detail routing engine 114 in FIG. 1) to start from the source and route the first interconnect or net along the track or location identified or created at 404. In some embodiments, the method or system may comprise the respective process or module 408 of identifying one or more adjacent shapes in a halo or the vicinity of the first interconnect or net.

In some of these embodiments, existing shapes in the region or layer of interest have been pre-processed to augment their original shapes by the associated design rules (e.g., one or more simple or complex spacing rules, one or more width rules, etc.) so the process or module 406 only needs to identify such neighboring shapes. In some other embodiments where the existing shapes are not processed to augment their respective as-designed shapes with the associated design rules, process or module 408 may identify the one or more neighboring shapes and their associated one or more design rules. In some embodiments, the method or system may comprise the respective process or module 410 of identifying a second track or location for continuing to create or route the first interconnect or net.

In addition, process or module 410 may further identify one or more design rules associated with an interconnect or a net if the interconnected or net is implemented along the second track or location. The method or system may use the one or more design rules to determine whether or not a portion of the first interconnect may be implemented along the second track or location. In some embodiments, the method or system may comprise the respective process or module 412 of creating one-dimensional geometric data for a first jog for the first interconnect or net along the second track, grid line, or location by performing one or more Boolean operations on the portion of the first interconnect or net that is implemented at 406 and on the one or more neighboring shapes identified at 408. In some embodiments, the method or system may comprise the respective process or module 414 of determining the geometric data to complete.

In some embodiments, the geometric data include intermediate geometric results or data during performance of some of the Boolean operations. For example, the geometric data may include the intermediate results of performing one or more Boolean operations on the first interconnect and the one or more neighboring shapes on one side of the first interconnect without performing Boolean operations on the first interconnect and the one or more other neighboring shapes on the other side of the first interconnect. In some embodiments, the method or system may comprise the respective process or module 416 of determining the final geometric data for the first interconnect. The method or the system may further transform the one-dimensional geometric data of the final shape of the first interconnect back into the two-dimensional geometric data. The method or system may perform processes or modules 410 through 416 repeatedly as the first interconnect or net is being implemented until the first interconnect or net is completed.

Figure 5:
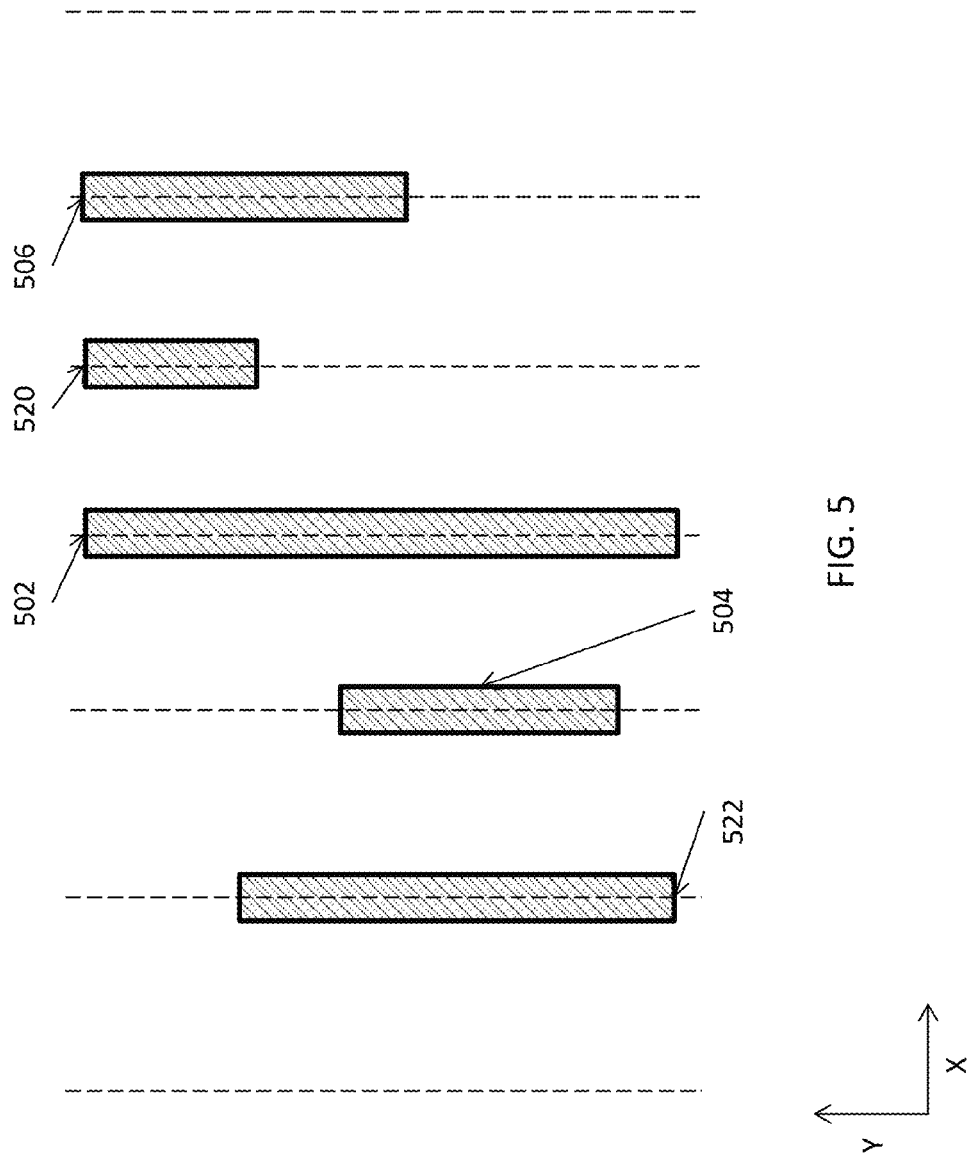

FIGS. 5 and 5A-H illustrate the application of an illustrative spreading process with a spreading distance to a portion of an illustrative layout in accordance with some embodiments described herein. FIG. 5 illustrates a portion of an illustrative layout that is to be implemented by using various processes or modules according to some embodiments described herein. In this illustrative layout portion, interconnect 502 has a neighboring interconnect 520 near the top portion and another neighboring interconnect 504 near the bottom portion. The illustrative layout portion further includes two more interconnects 522 and 506 which are the neighboring interconnects within a predetermined halo or distance for the interconnect 502 to be modified to satisfy one or more controlling design rules. FIG. 5 further illustrates that a spacing requires a two-pitch spacing between two immediately neighboring interconnects.

Figure 5A:
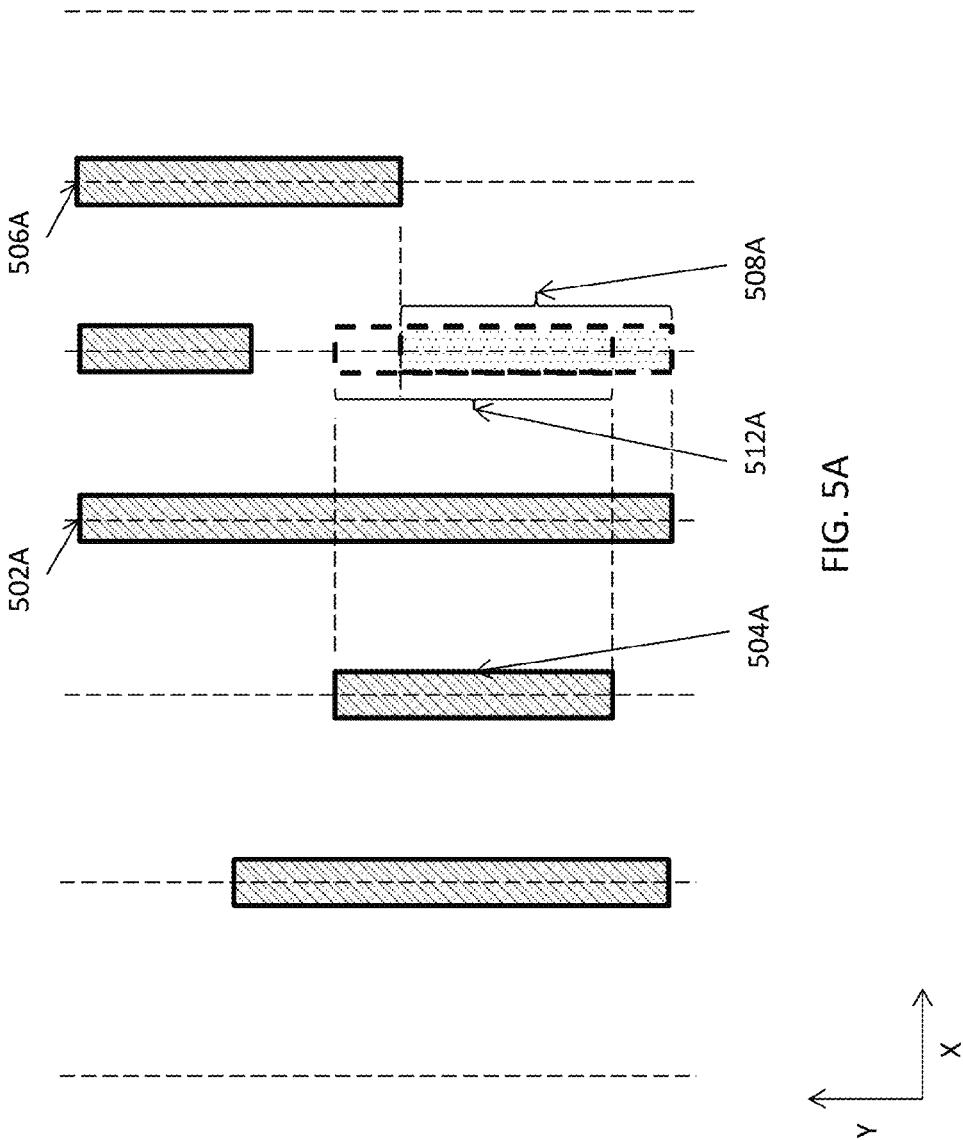

As shown in FIG. 5, most portion of interconnect 502 does not satisfy the two-pitch spacing rule because there exists only one-pitch spacing between, for example, interconnects 502 and 504 as well as between interconnects 502 and 520. FIGS. 5A-H illustrate some examples of utilizing certain aspects of the techniques described herein to satisfy the two-pitch spacing rule with respect to interconnect segment 502. FIG. 5A also illustrates an illustrative process to identify or determine an interconnect for processing in accordance with some embodiments described herein. It shall be noted that FIG. 5 merely illustrates a portion of a layout and thus portions of interconnects without showing any sources or destinations of at least some of the interconnects. Nonetheless, various embodiments described herein examine an interconnect or net of interest in its entirety, rather than simply a segment of an interconnect or net within a confined boundary such as a switch box. In this illustrated example, another process or module (e.g., process or module 206E) may identify or determine the set of spreading distance to include {two-pitches, 1-pitch, ½-pitch, ¼-pitch} in either direction of an interconnect or net. In examining the layout, the process or module (e.g., process or module 212E in FIG. 2E) may examine these interconnects to identify the interconnect for further processing.

For example, the process or module may determine according to some embodiments that interconnects 522, 504, 506, and 520 are not to be processed because these interconnects cannot be spread to another track two-pitches away. It shall be noted that a track may include a routing track that represents an imaginary line having zero thickness and may be determined from a set of manufacturing grids provided by a semiconductor foundry. A track may also include a manufacturing grid line defining the manufacturing grids provided by a semiconductor foundry. A track may even include a fictitious line having zero thickness generated or identified by an electronic circuit designer to use various techniques described herein. In other words, various embodiments and techniques described herein may be applied to both tracked electronic designs and trackless electronic design with full and equal effects. In addition or in the alternative, an electronic circuit designer may identify or even generate a fictitious line even in advance or on the fly to use various techniques described herein, if such a fictitious line is needed to facilitate or aid the use of various techniques described herein. In some other embodiments, the process or module may identify interconnect 502 as the interconnect of interest because at least a portion of interconnect 502 may be moved over to the track on which interconnect 520 resides and may thus resolve the two-pitch spacing rule violation. In some other embodiments, process or module may examine each interconnect in a certain order and identify the interconnects that may be processed with a given spreading distance. In these embodiments, the process or method may identify the next spreading distance after all the interconnects that may be processed with a spreading distance have been processed. In some of these embodiments, the process or method may start with the greatest spreading distance and use the next spreading distances to identify interconnects for processing in an descending order. In some other embodiments, the process or method may start with the smallest spreading distance and use the next spreading distances to identify interconnects for processing in an ascending order.

FIG. 5A illustrates the first part of a process or module (e.g., process or module 212E) for processing an interconnect for compliance with one or more design rules associated with the physical implementation of an electronic design. As illustrated in FIG. 5A, the method or system may identify interconnect 502A as the interconnect of interest and performs various operations to resolve the violation of a two-pitch spacing design rule caused by the original interconnect 502A. The method or system first identifies the track for resolving the violation of the two-pitch spacing rule by using a one-pitch spreading distance. More specifically, the method or system identifies the track to the right of the original track on which interconnect 502A lies. The method or system then performs a first intersection operation of 502A and 504A to form 512A along the newly identified track, i.e., 502A∩504A=512A.

Figure 5B:
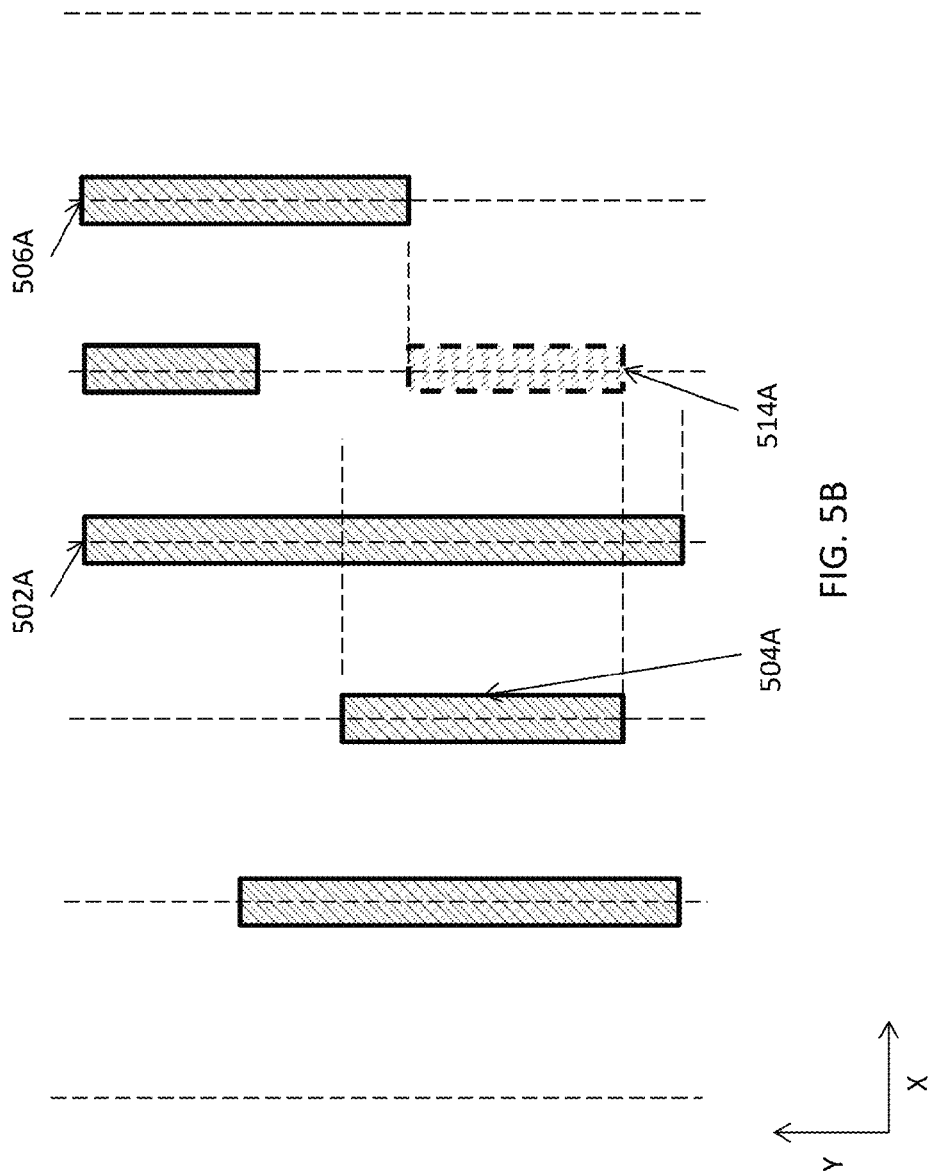

The method or system then performs a subtraction operation to subtract 506A from 502A to form 508A along the newly identified track, i.e., 502A−506A=508A. It shall be noted that these shapes 502A, 504A, 506A, etc. have been pre-processed into one-dimensional geometric entities by recording, for example, the Y-coordinates of these vertical interconnect segments, and thus these operations may be performed by performing simple arithmetic operations on numbers. For example, 502A may be represented as $\{Y1_{502A}, Y2_{502A}\}$, and 506A may be represented as $\{Y1_{502A}, Y2_{502A}\}$. The subtraction of 506A from 502A may be obtained by performing simple subtraction operations on numbers as $\{Y1_{502A}-Y1_{506A}, Y2_{502A}-Y2_{506A}\}$. The simple arithmetic operations used in these processes and methods greatly improves the runtime of various processes or modules. The method or system may then perform an intersection of 508A and 512A to obtain 514A as shown in FIG. 5B, i.e., 508A∩512A=514A. The geometric shape 514A represents the vertical segment of a jog of the original interconnect to satisfy the two-pitch spacing requirement.

In FIG. 5C, the method or the system further performs additional processes to complete the jog for the original interconnect. More specifically, the method or system subtracts the corresponding one-dimensional data of 514A from the original interconnect 502A to form the disconnected shape 516A and shape 516A', i.e., 502A−514A=(516A∪516A'). This operation further illustrates the ease, simplicity, and speed of processing or routing interconnects in various embodiments described herein. FIG. 5D illustrates that the method or system completes the jog by connecting the end Y-coordinates of 516A, 516A', and 514A and using the respective Y-coordinates as the centerlines of the horizontal interconnect segments 518A and 518A' of the jog (see FIG. 5D). For example, the centerline of the interconnect segment 518A' may be determined to coincide with the upper Y-coordinate (in the orientation of FIG. 5C or FIG. 5D) of the interconnect segment 516A' or the lower Y-coordinate of the interconnect segment 514A. Similarly, the centerline of the interconnect segment 518A' may be determined to coincide with the upper Y-coordinate of the interconnect segment 514A or the lower Y-coordinate of the interconnect segment 516A. It shall be noted that the centerlines of the interconnect segments 518A and 518A' appear to coincide with the respective end points of 506A and 504A in these figures. Nonetheless, one or both of these two interconnect segments may be further set apart from each other based at least in part upon what one or more design rules require.

FIG. 5D illustrates that the method or system performs similar processes to create another jog to satisfy the two-pitch spacing rule violated by the intermediate interconnect segments 516A and 516A' and interconnect segment 520A. The method or system first performs an intersection of the union of 516A and 516A' and 520A to form 524A, i.e., 516A∪516A'∩520A=524A. The method or system then subtracts interconnect 522A from the intermediate the union of interconnect segment 516A and interconnect segment 516A' to form 526A, i.e., (516A∪516A')–522A=526A. The method or system then perform an intersection of 524A and 526A to form 528A, i.e., 524A∩526A=528A as illustrated in FIG. 5F.

Figure 5G:
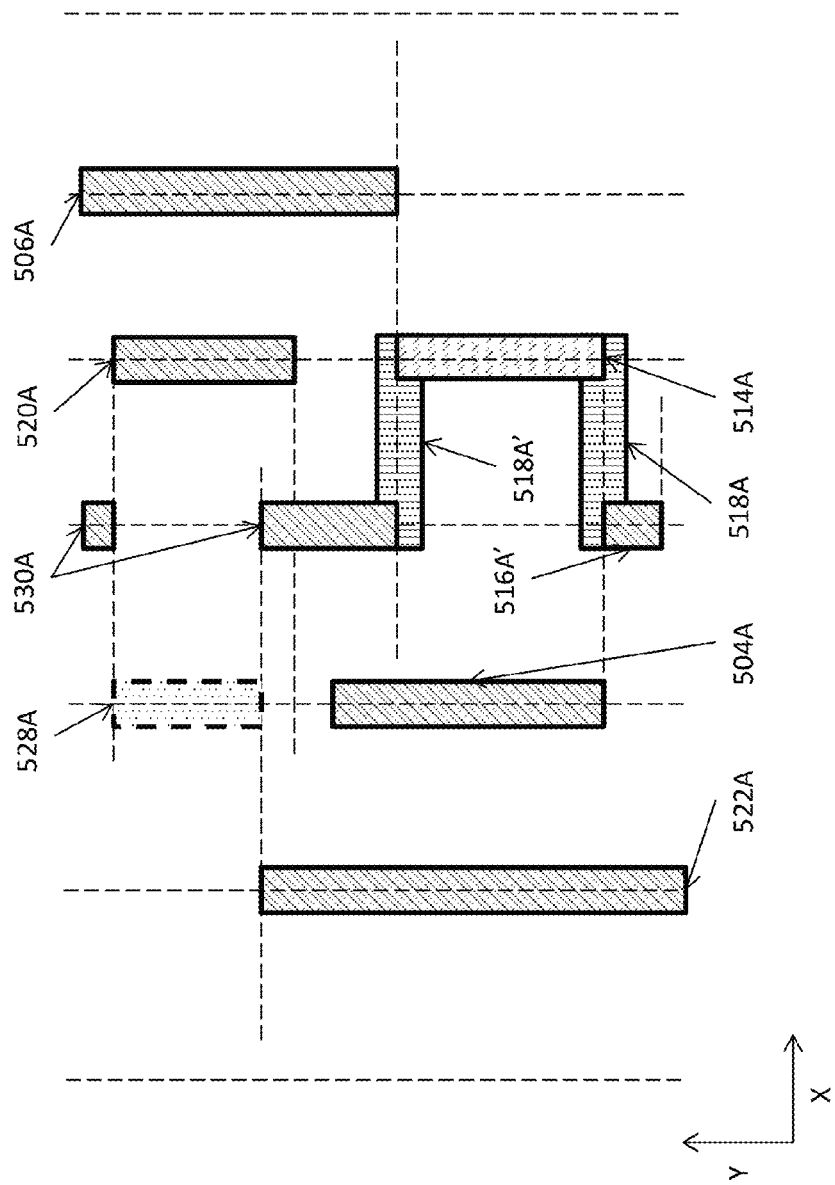
Figure 5H:
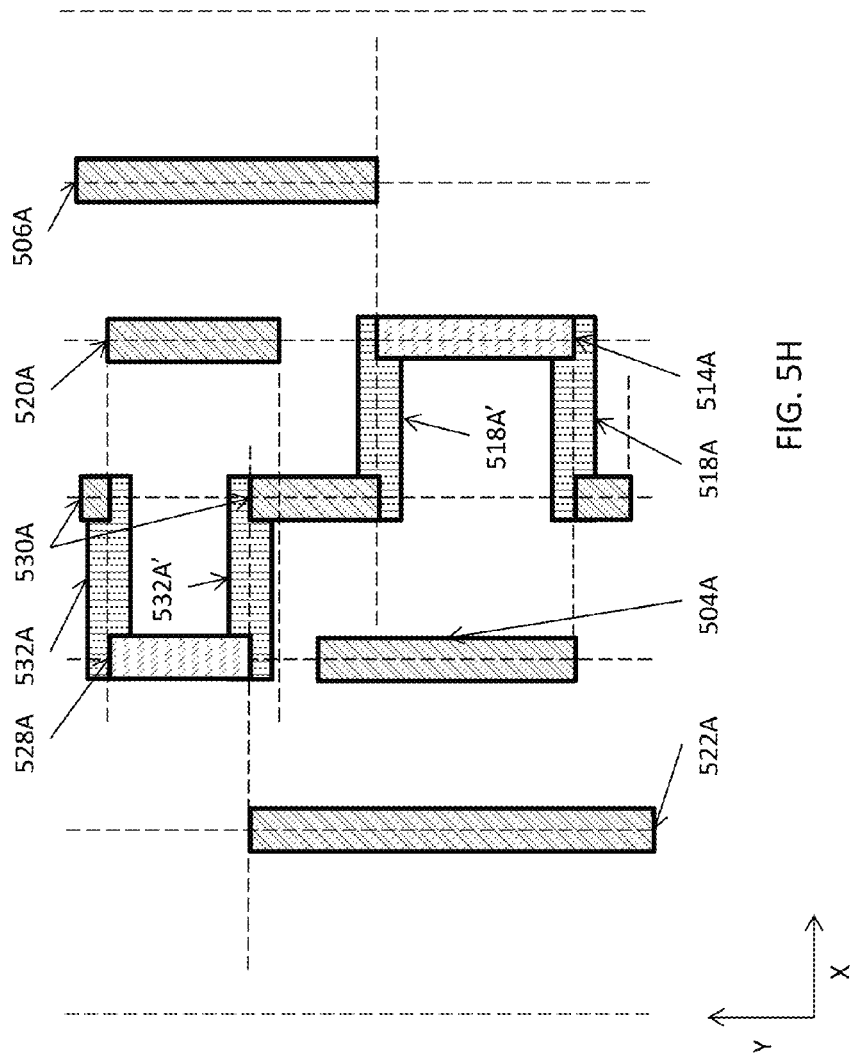

The method or system then subtracts 528A from the intermediate interconnect segments 516A and 516A' to form 530A by subtracting the Y-coordinates of 528A from the Y-coordinates of 516A (i.e., (516A∪516A')–528A=530A) and stores the results for 530A as shown in FIG. 5G. Once the vertical segment of the jog 528A and the subtraction have been formed, the method or the system may then complete the jog by connecting the end Y-coordinates of 530A and 528A with horizontal segments having the X-coordinates of the two tracks and using the respective Y-coordinates of these two segments as the centerlines of the horizontal interconnect segments 532A and 532A' of the jog as shown in FIG. 5H. The modified interconnect 502A now includes two jogs at one-pitch spacing from its original location to clear the two-pitch spacing rule caused by the original interconnect 502A and the two interconnect segments 520A and 504A. The Boolean algebraic equation for the final form of the interconnect 502A has the following form:

(502A–((502A∩504A)∪(502A–506C))–
  (((516A∪516A')∩520A)∩((516A∪516A')–
  522A))∪((502A∩520A)∪(502A–506C))∪
  (((516A∪516A')∩520A)∩((516A∪516A')–
  522A))∪(518A∪518A')∪(532A∪532A')

FIG. 5-H illustrate an illustrative application of some embodiments with a one-pitch spreading distance to a portion of an illustrative layout where the interconnects are subject to a two-pitch spacing rule. The method or system may identify a halo with a two-pitch expansion distance around the target tracks of an interconnect of interest (interconnect 502A in this example) and identify the shapes (e.g., shape 506A and 522A) for the Boolean operations. The method or system then performs the Boolean operations on the interconnect of interest (e.g., interconnect 502A), the neighboring interconnects (e.g., interconnects 520A and 504A), and the interconnects within the halo (e.g., interconnects 522A and 506A) to form the final shape of the interconnect 502A.

It shall be noted that although a two-pitch spacing rule, a one-pitch spreading distance, and vertical interconnect segments are used in this example, these entities are used in this example for illustration and explanation purposes and are not intended to limit the scope of various other embodiments or the scope of the claims, unless otherwise specifically claimed or recited. It shall also be noted that a jog in these figures is represented as connected horizontal and vertical interconnect segments. Nonetheless, in some embodiments where wrong-way routing is prohibited, the method or system may insert a via at the junction of a vertical segment and a horizontal segment to comply with the right-way-routing-only design rule.

Figure 6B:
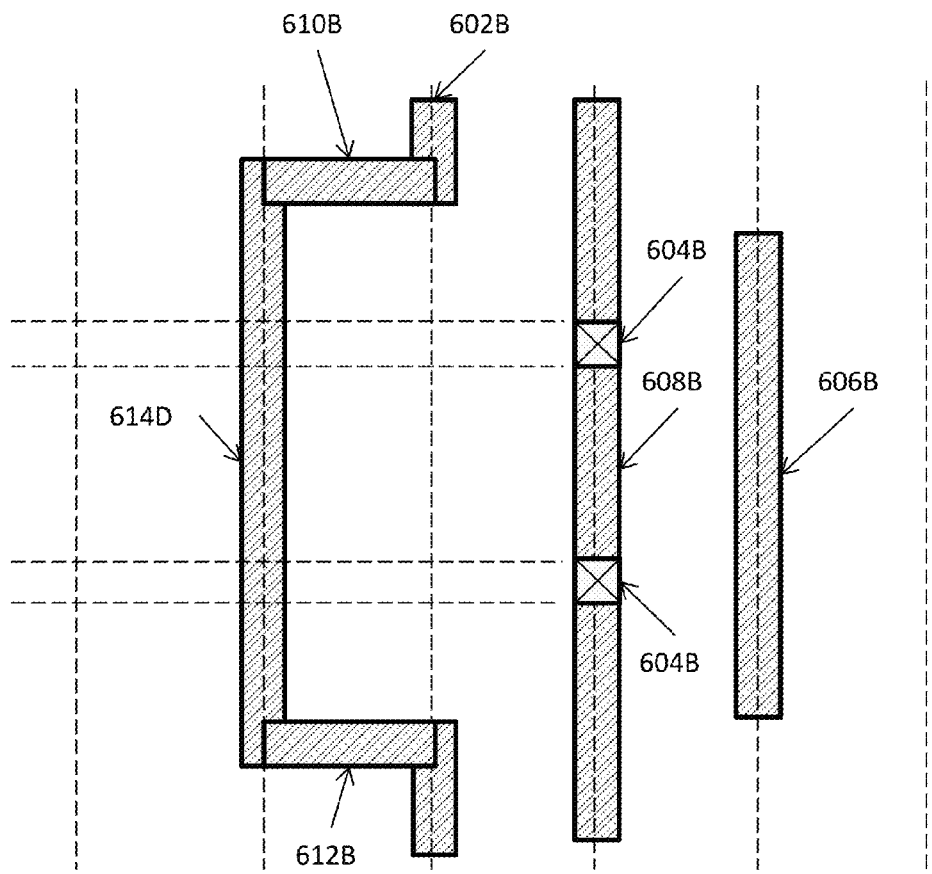
Figure 6B:
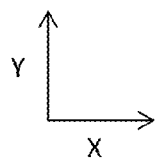

FIGS. 6A-E illustrate an evolution of an illustrative implementation of a portion of an electronic design by using some methodologies described herein in some embodiments. More specifically, FIG. 6A illustrates the application of some embodiments described herein to route or process interconnects subject to an enclosure edge rule. The portion of an illustrative layout includes interconnects 602A, 608A, and 606A, where interconnect 608A further includes two vias 604A along interconnect segment 608A. The inclusion of the vias 604A along interconnect 608A causes a violation of the enclosure edge rule that prohibits having two interconnect segments on both sides of and at equal distance to the vias 604A. If interconnect 608A had not included these two vias 604A, this portion of the illustrative layout including these three interconnects 602A, 608A, and 606A would have been DRC (design rule check) clean with respect to the via enclosure edge rule although this illustrative portion of the layout may nonetheless be subject to one or more other design rules.

Figure 6C:
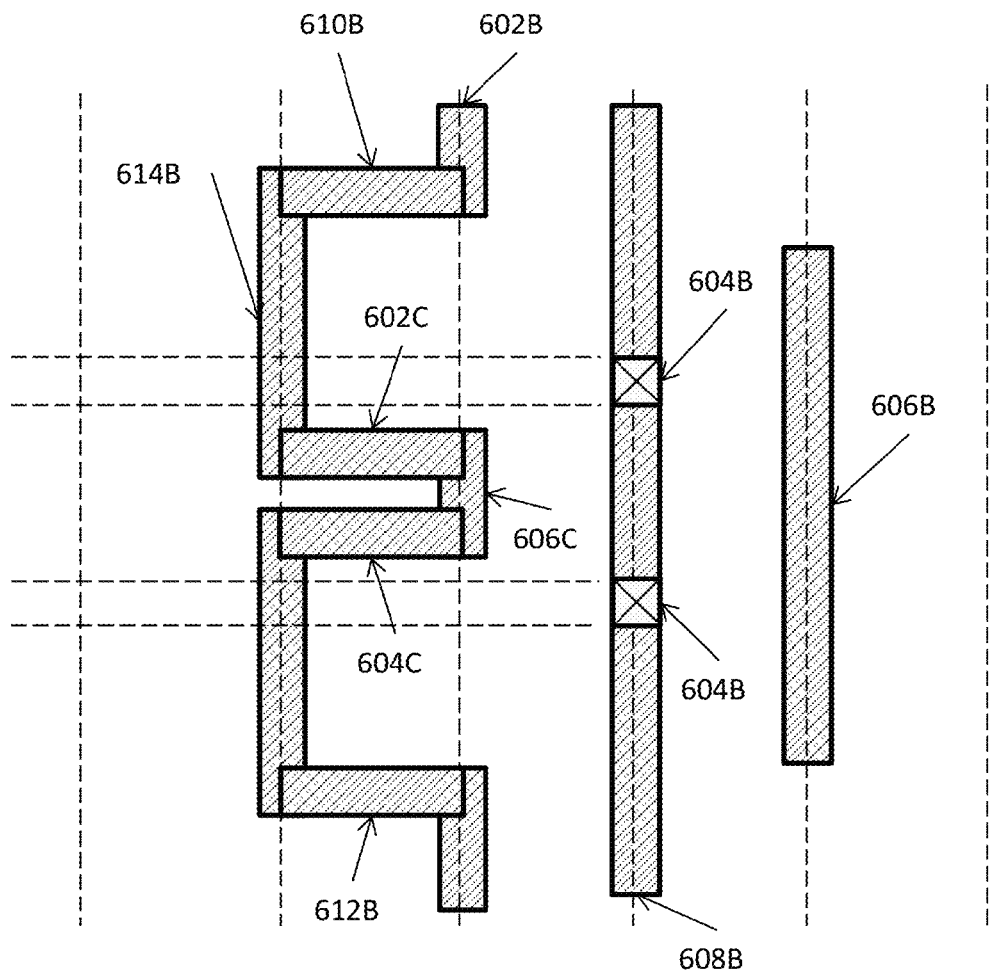
Figure 6C:
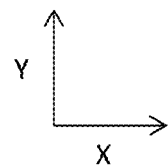

FIG. 6B illustrates an illustrative fix or routing of interconnect 602B for the portion of the illustrative layout including interconnects 602B, 608B, and 606B, where interconnect 608B includes two vias 604B. More specifically, the method or system creates a jog including the horizontal interconnect segments 610B and 612B and a vertical interconnect segment 614B. It shall be noted that although the method or system processes or manipulates interconnect 608B in FIG. 6B, the method or system may also process or manipulate interconnect 606B to achieve substantially the same purpose in other embodiments. FIG. 6C illustrates further processing of the interconnect segments to further clear the enclosure edge rule by creating interconnect segments 602C, 604C, and 606C. As a result, interconnect 602A now includes the segments 602B, 610B, 614B, 602C, 604C, 606C, and 612B. In this illustrative fix or routing to form the final shape of interconnect 602A, this portion of the illustrative layout satisfies the enclosure edge rule because there exist no two interconnect segments on both sides of and at equal distance to the vias 604A on interconnect 608A. It shall be noted that the figures are presented in this Application for illustration and explanation purposes and are not drawn to scale, unless otherwise specifically recited or noted. Therefore, the interconnect segment 606C, which appears to be a short segment in FIG. 6C and thus might have violated one or more other design rules (e.g., minimum spacing rules) had FIG. 6C were drawn to scale, is not intended to demonstrate the layout portion to scale.

Figure 6D:
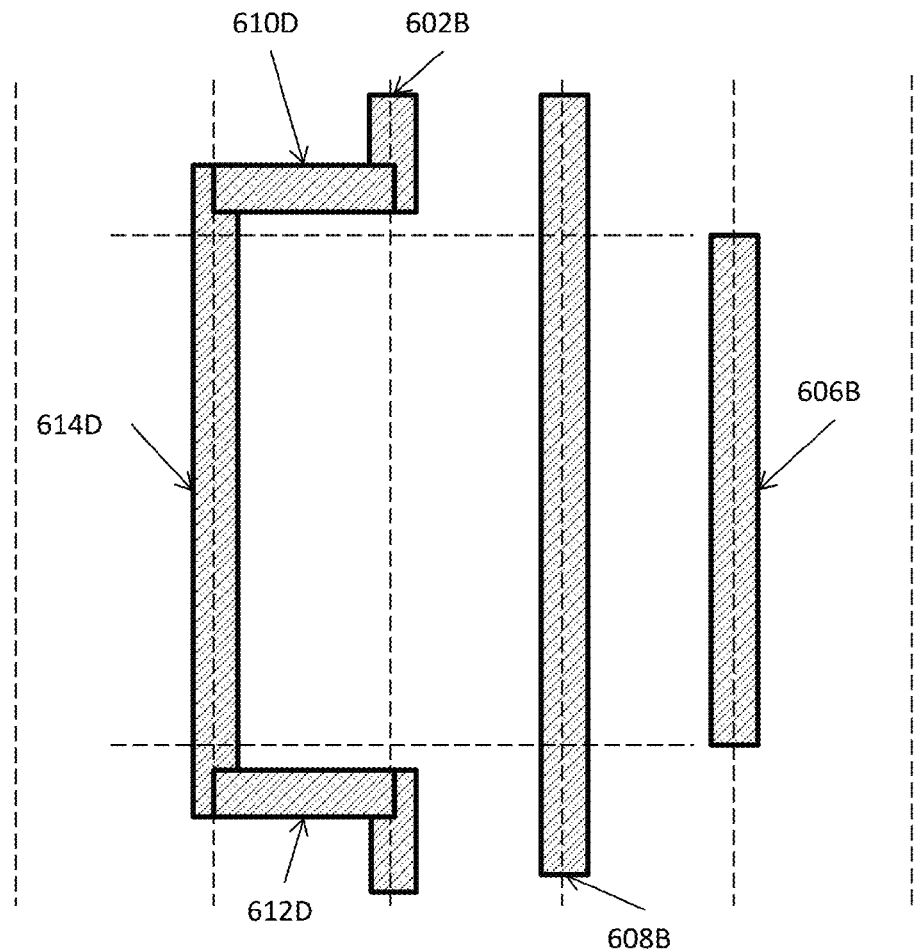

FIGS. 6D-E illustrates two other illustrative examples of routing of interconnect 602B for a simplified portion of the illustrative layout portion illustrated in FIG. 6A. More particularly, the illustrative layout portion in FIGS. 6D-E is substantially identical to that illustrated in FIG. 6A, yet the illustrative layout portion in FIGS. 6D-E does not include the two vias 604A. This illustrative layout portion may be improved upon by using some techniques described herein to improve upon, for example but not necessarily limited to, the timing, performance, or signal integrity by creating one or more additional jogs or bends to set at least a portion of interconnect segment 602B further apart from interconnect segment 608B. It shall be noted that although interconnect segment 606B remains unchanged, similar changes may be made to interconnect segment 606B. In addition or in the alternative, interconnect segment 602B is modified to include two jogs or bends in FIG. 6D. Nonetheless, other modifications such a single jog or bend may also be possible. Therefore, FIGS. 6D-E are presented for illustration and explanation purposes but are not intended to limit the scope of various other embodiments or the scope of the claims as such.

By following a similar approach as those illustrated in FIGS. 5A-H, the interconnect segment 602A may be modified to include two jogs including the segments 610D, 612D, and 614D as shown in FIG. 6D or interconnect segments 610E, 612E, and 614E as shown in FIG. 6E. FIG. 6D differs from FIG. 6E in that the centerlines of interconnect segments 610E and 612E respectively coincide with the end points of interconnect segment 606B in FIG. 6E, whereas interconnect segments 610D and 612D are set further away from the end points of interconnect segment 606B in FIG. 6D. The actual location of the jogs (e.g., the actual locations of interconnect segments 610D and 612D with respect to the end points of interconnect segment 606B) may be determined based at least in part upon, for example, one or more design rules.

Figure 7A:
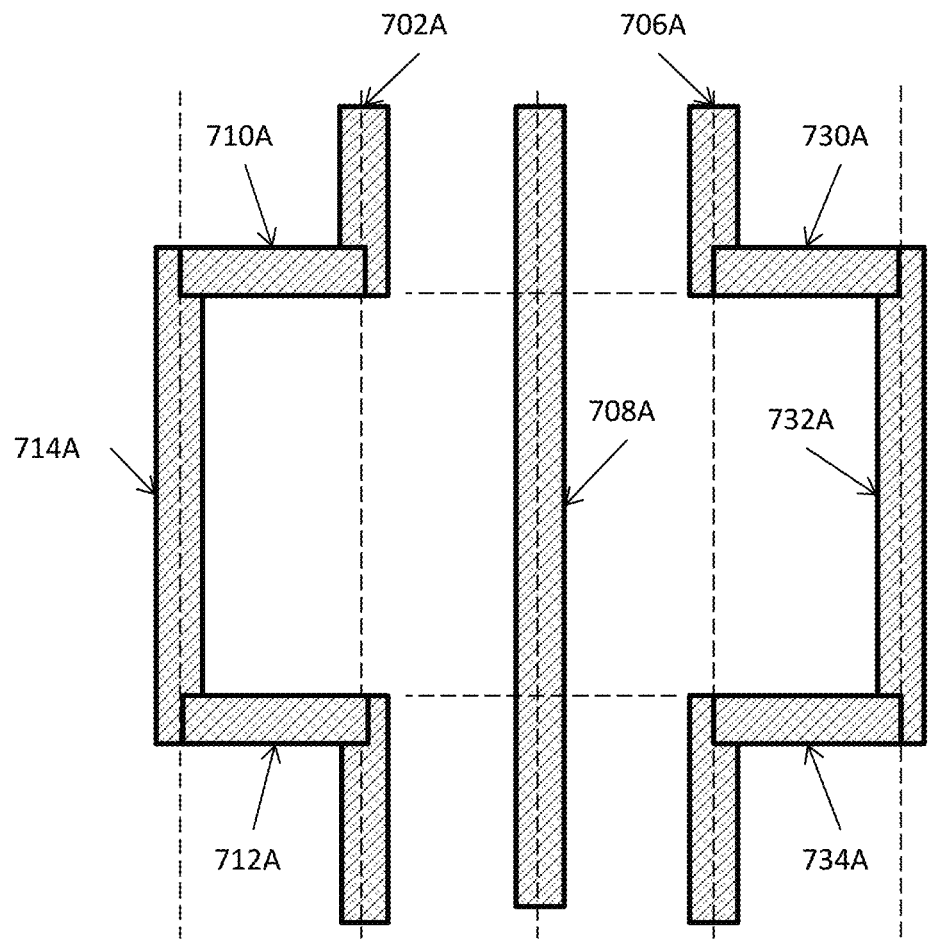
FIGS. 7A-C illustrate an evolution of an illustrative implementation of a portion of an electronic design by using some methodologies described herein in some embodiments.
Figure 7A:
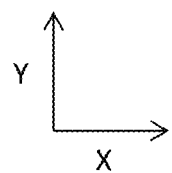

FIGS. 7A-D illustrate an evolution of an illustrative implementation of a portion of an electronic design by using some methodologies described herein in some embodiments. More specifically, FIG. 7A illustrates a portion of an illustrative layout that is subject to the opposite edge spacing rule in some embodiments. The portion of the illustrative layout includes three interconnects 708A, and two interconnects with jogs. The first jogged interconnect includes interconnect segments 702A, 710A, 714A, 712A, and the second jogged interconnect includes interconnect segments 706A, 730A, 732A, and 734A.

Figure 7B:
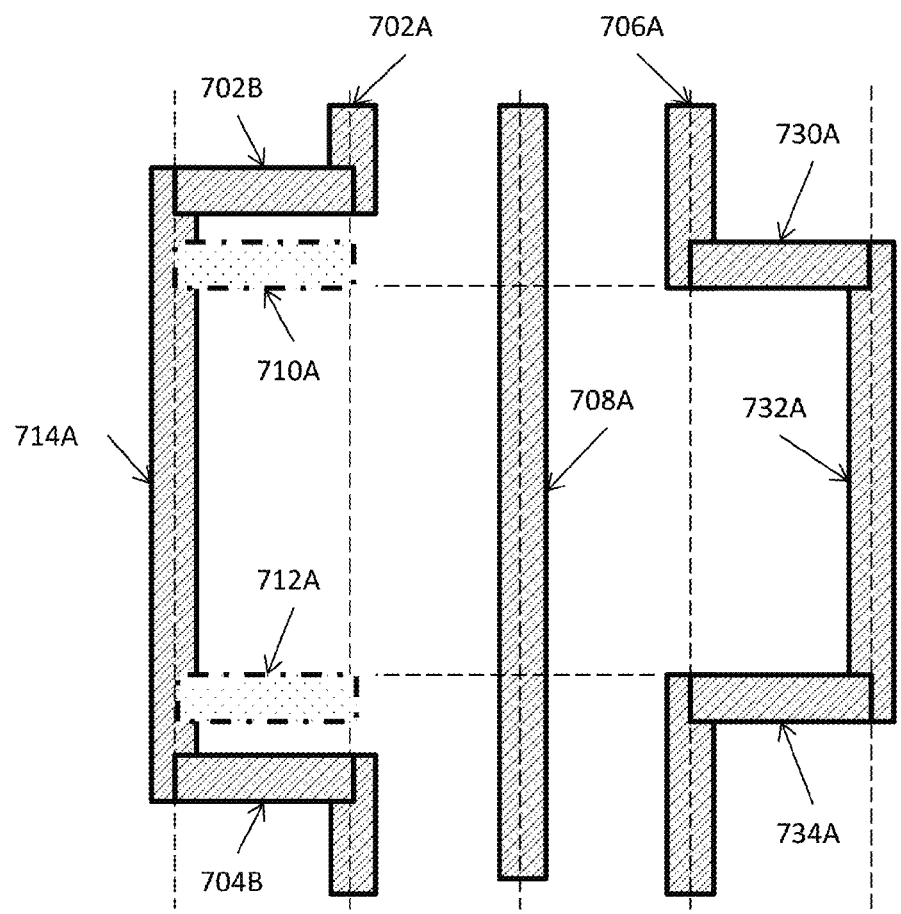
Figure 7B:
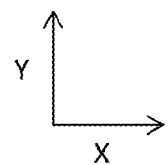

This portion of the illustrative layout violates the opposite edge spacing rule that prohibits an interconnect having a mirror-image of a jog of another interconnect on both sides of the other interconnect. FIG. 7B illustrates a first fix or routing of one of the two mirror-imaged interconnects in some embodiments. More specifically, the method or system moves interconnect segments 710A and 712A further apart to form interconnect segments 702B and 704B. As it can be seen from FIG. 7B, the two interconnects on both sides of interconnect 708A are no longer mirror image of each other. This portion of the illustrative layout thus satisfies the opposite edge spacing rule.

Figure 7C:
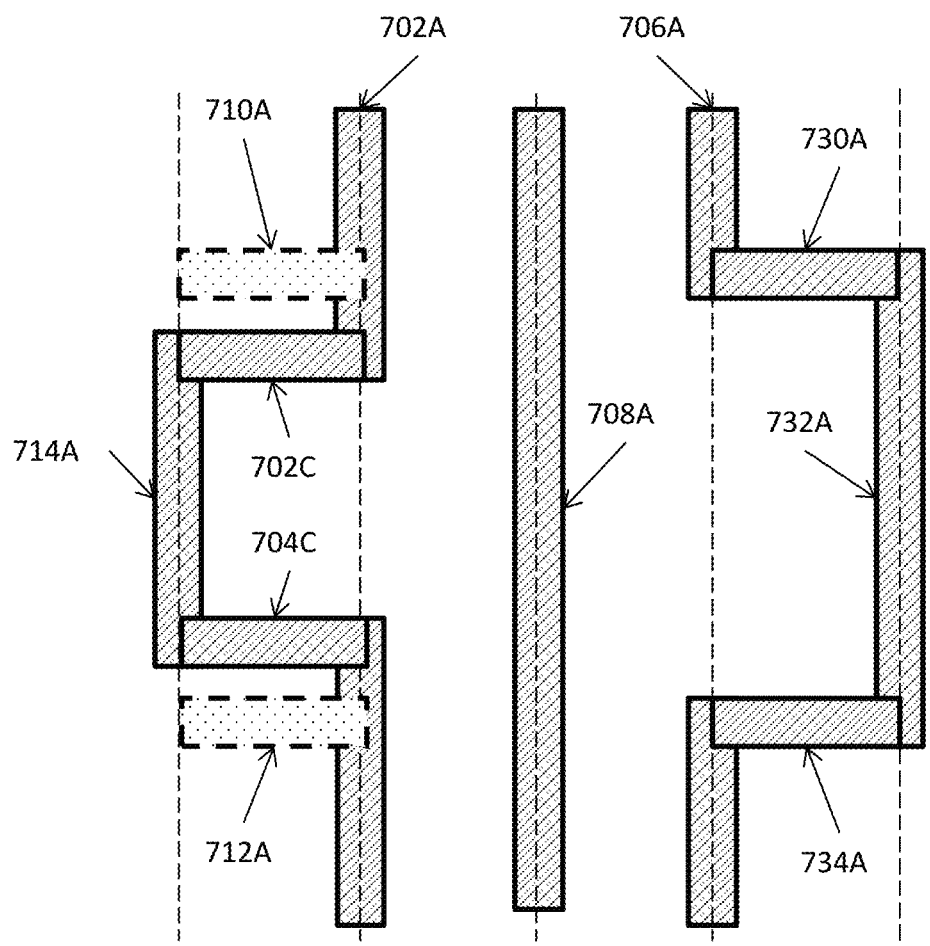

FIG. 7C illustrates a second fix or routing of one of the two mirror-imaged interconnects where interconnect segments 710A and 712A are moved further apart to form interconnect segments 702C and 704C in some embodiments. As it can be seen from FIG. 7C, the two interconnects on both sides of interconnect 708A are no longer mirror image of each other. This portion of the illustrative layout thus satisfies the opposite edge spacing rule. The jog in this illustrative fix or routing shown in FIG. 7C is shorter than that shown in FIG. 7B. In some embodiments where shorter jogs are preferred over longer jogs, the fix or routing illustrated in FIG. 7C is preferred over that illustrated in FIG. 7B.

System Architecture Overview

Figure 8:
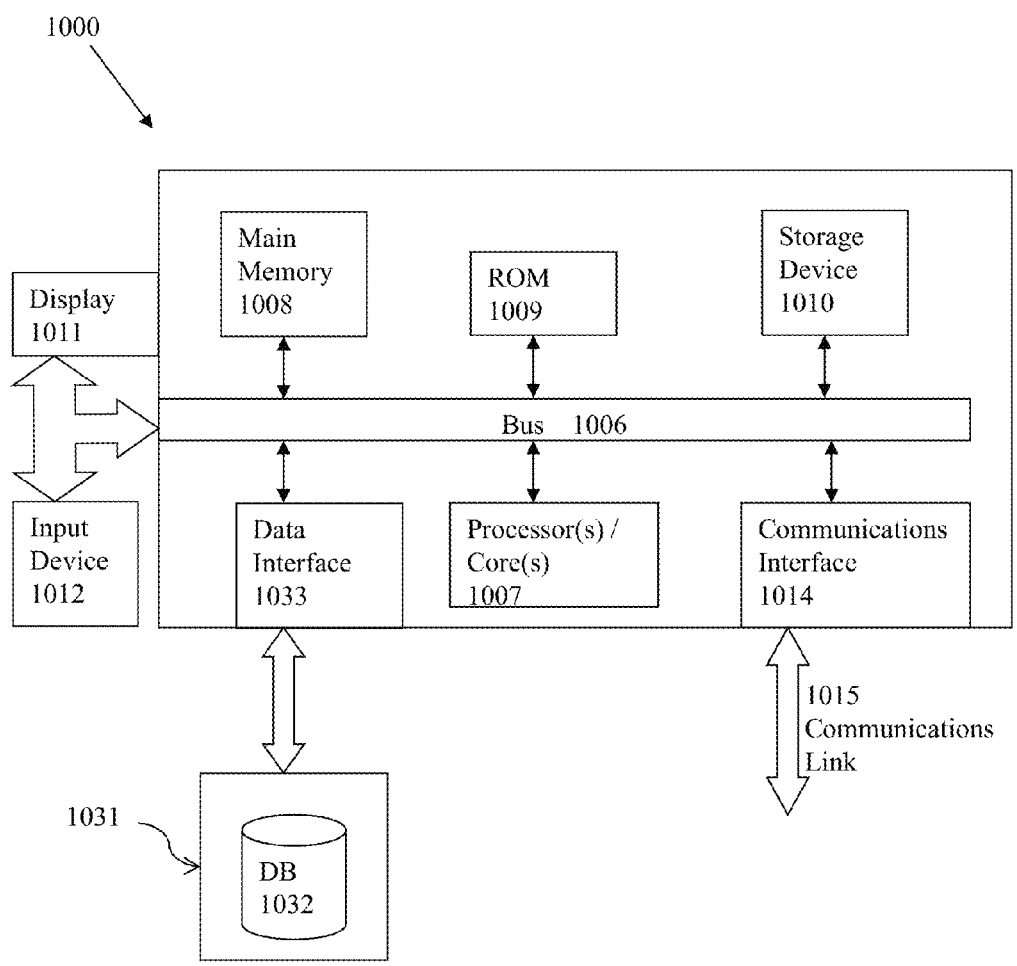
FIG. 8 illustrates a computerized system on which a method for implementing electronic design using flexible routing tracks may be implemented.

FIG. 8 illustrates a block diagram of an illustrative computing system 1000 suitable for implementing analog behavioral modeling and IP (intellectual property) integration using SystemVerilog Hardware Description Language (HDL) as described in the preceding paragraphs with reference to various figures. Computer system 1000 includes a bus 1006 or other communication mechanism for communicating information, which interconnects subsystems and devices, such as processor 1007, system memory 1008 (e.g., RAM), static storage device 1009 (e.g., ROM), disk drive 1010 (e.g., magnetic or optical), communication interface 1014 (e.g., modem or Ethernet card), display 1011 (e.g., CRT or LCD), input device 1012 (e.g., keyboard), and cursor control (not shown).

According to one embodiment, computer system 1000 performs specific operations by one or more processor or processor cores 1007 executing one or more sequences of one or more instructions contained in system memory 1008. Such instructions may be read into system memory 1008 from another computer readable/usable storage medium, such as static storage device 1009 or disk drive 1010. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1007, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 1007 for execution. Such a medium may take many forms, including but not limited to, non-volatile media and volatile media. Non-volatile media includes, for example, optical or magnetic disks, such as disk drive 1010. Volatile media includes dynamic memory, such as system memory 1008.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1000. According to other embodiments of the invention, two or more computer systems 1000 coupled by communication link 1015 (e.g., LAN, PTSN, or wireless network) may perform the sequence of instructions required to practice the invention in coordination with one another.

Computer system 1000 may transmit and receive messages, data, and instructions, including program, i.e., application code, through communication link 1015 and communication interface 1014. Received program code may be executed by processor 1007 as it is received, and/or stored in disk drive 1010, or other non-volatile storage for later execution. In an embodiment, the computer system 1000 operates in conjunction with a data storage system 1031, e.g., a data storage system 1031 that contains a database 1032 that is readily accessible by the computer system 1000. The computer system 1000 communicates with the data storage system 1031 through a data interface 1033. A data interface

1033, which is coupled to the bus 1006, transmits and receives electrical, electromagnetic or optical signals that include data streams representing various types of signal information, e.g., instructions, messages and data. In embodiments of the invention, the functions of the data interface 1033 may be performed by the communication interface 1014.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for enhancing metrics of an electronic design using design rule driven physical design implementation techniques, comprising:
   using a computing system having at least one processor to perform a process, the process comprising:
   identifying a first layer in a layout of an electronic design;
   identifying a plurality of spreading distances respectively corresponding to a plurality of sets of interconnects in the layout and
   processing an interconnect having a predetermined width in a set of interconnects on the first layer by at least performing a spreading operation on the interconnect based at least in part upon a first spreading distance corresponding to the set of interconnects, wherein
       the spreading operation offsets a segment of the interconnect by the first spreading distance to create a modified interconnect including two or more bends along the interconnect and the predetermined width while maintaining a remaining portion of the layout unchanged to satisfy one or more design criteria.

2. The computer implemented method of claim 1, the process further comprising:
   performing the spreading operation on the interconnect based at least in part upon a second spreading distance; and
   determining whether the interconnect, on which the spreading operation has been performed based at least in part upon the second spreading distance, violates one or more design rules.

3. The computer implemented method of claim 2, the process further comprising:
   determining a set of spreading distances that includes the first spreading distance and the second spreading distance; and
   ordering the set of spreading distances in a first order.

4. The computer implemented method of claim 3, wherein the first order includes an ascending order or a descending order.

5. The computer implemented method of claim 3, the process further comprising:
   iterating through multiple spreading distances in the set of spreading distances based at least in part upon one or more stopping criteria.

6. The computer implemented method of claim 5, the one or more stopping criteria including at least one of:
   all spreading distances in the set of spreading distances have been used in the spreading operation; and
   all interconnects in the first layer have been processed to exhibit no design rule violations.

7. The computer implemented method of claim 1, further comprising:
   identifying a set of design rules;
   pre-processing a first interconnect with at least some of the set of design rules by at least augmenting the first interconnect with at least some of the set of design rules;
   forwarding information about the first interconnect to the act of performing the spreading operation on the interconnect for modifying the first interconnect; and
   determining whether the interconnect, which has been processed by at least the spreading operation, violates the set of design rules.

8. The computer implemented method of claim 7, wherein the interconnect comprises at least one of an existing interconnect that already exists in the first layer or a newly created interconnect that is to be created in the first layer of the electronic design.

9. The computer implemented method of claim 8, wherein the at least some of the set of design rules comprise a spacing rule or a width rule for the interconnect.

10. The computer implemented method of claim 1, further comprising:
    determining whether the interconnect includes a via along the interconnect;
    determining whether the via along the interconnect can be moved to another location based at least in part upon the spreading operation or the first spreading distance; and
    forwarding results of determining whether the via along the interconnect can be moved to the act of performing the spreading operation on the interconnect for modifying the interconnect.

11. A computer implemented method for physically implementing a layout of an electronic design, comprising:
    using a computing system having at least one processor to perform a process, the process comprising:
    identifying a plurality of spreading distances respectively corresponding to a plurality of sets of interconnects in the layout;
    identifying a first spreading distance having a predetermined width from the plurality of spreading distances and an interconnect from the plurality of sets of interconnects for implementation;
    identifying one or more first adjacent shapes for the interconnect within a halo;
    processing the interconnect by offsetting a segment of the interconnect by the first spreading distance to create a modified interconnect including two or more bends along the interconnect and the predetermined width while maintaining a remaining portion of the layout unchanged to satisfy one or more design criteria based at least in part upon the one or more first adjacent shapes; and
    determining a final shape for the interconnect based at least in part upon results of processing the interconnect.

12. The computer implemented method of claim 11, the process further comprising:
    creating first one-dimensional data for at least a first portion of the interconnect; and
    performing some of a set of Boolean operations upon the at least the first portion of the interconnect and the one or more first adjacent shapes for the interconnect, wherein the one or more first adjacent shapes reside on one side of the interconnect.

13. The computer implemented method of claim 12, the process further comprising:
    identifying one or more second adjacent shapes for the interconnect within the halo;

processing the interconnect based at least in part upon the one or more second adjacent shapes;

creating second one-dimensional data for at least a second portion of the interconnect; and performing some of the set of Boolean operations upon the at least the second portion of the interconnect and the one or more second adjacent shapes for the interconnect, wherein the one or more second adjacent shapes reside on a different side of the interconnect.

14. The computer implemented method of claim 11, the process further comprising:

creating intermediate one-dimensional data for the interconnect;

creating final one-dimensional data for the interconnect; and converting the final one-dimensional data for the interconnect into two-dimensional data for the final shape of the interconnect for a layout of the electronic design.

15. The computer implemented method of claim 11, the process further comprising:

identifying a first interconnect;

identifying a first track for routing the first interconnect or net; and routing at least a first portion of the first interconnect using the first track.

16. The computer implemented method of claim 15, the process further comprising:

identifying one or more first neighboring shapes for the first interconnect within a first halo for the first interconnect; and identifying a second track for routing at least a second portion of the first interconnect using the second track.

17. The computer implemented method of claim 16, the process further comprising:

identifying a set of design rules associated with at least the first interconnect;

creating one-dimensional data for at least the second portion of the first interconnect along the second track based at least in part upon some of the set of design rules associated with at least the first interconnect;

creating final one-dimensional data for the first interconnect; and converting the final one-dimensional data for the first interconnect into two-dimensional data for the final shape of the first interconnect for a layout of the electronic design.

18. A system for enhancing metrics of an electronic design using design rule driven physical design implementation techniques, comprising:

a computing system having at least one processor that is to:

identify a first layer in a layout of an electronic design;

identify a plurality of spreading distances respectively corresponding a plurality of sets of interconnects in the layout; and process an interconnect having a predetermined width in a set of interconnects on the first layer by at least performing a spreading operation on the interconnect based at least in part upon a first spreading distance corresponding to the set of interconnects, wherein the spreading operation offsets a segment of the interconnect by the first spreading distance to create a modified interconnect including two or more bends along the interconnect and the predetermined width while maintaining a remaining portion of the layout unchanged to satisfy one or more design criteria.

19. The system of claim 18, wherein the at least one processor is further to:

perform the spreading operation on the interconnect based at least in part upon a second spreading distance;

determine whether the interconnect, on which the spreading operation has been performed based at least in part upon the second spreading distance, violates one or more design rules;

determine a set of spreading distances that includes the first spreading distance and the second spreading distance;

order the set of spreading distances in a first order; and iterate through multiple spreading distances in the set of spreading distances based at least in part upon one or more stopping criteria.

20. The system of claim 18, wherein the at least one processor is further to:

identify a set of design rules;

pre-process a first interconnect with at least some of the set of design rules by at least augmenting the first interconnect with at least some of the set of design rules;

forward information about the first interconnect to the act of performing the spreading operation on the interconnect for modifying the first interconnect; and determine whether the interconnect, which has been processed by at least the spreading operation, violates one or more design rules.

21. The system of claim 18, wherein the at least one processor is further to:

determine whether the interconnect includes a via along the interconnect;

determine whether the via along the interconnect can be moved to another location based at least in part upon the spreading operation or the first spreading distance; and forward results of determining whether the via along the interconnect can be moved to the act of performing the spreading operation on the interconnect for modifying the interconnect.

22. An article of manufacture comprising a non-transitory computer accessible storage medium having stored thereupon a sequence of instructions which, when executed by at least one processor executing one or more threads, causes the at least one processor to perform a method for enhancing metrics of an electronic design using design rule driven physical design implementation techniques, the method comprising:

using at least one processor to perform a process the process comprising:

identifying a first layer in a layout of an electronic design;

identifying a plurality of spreading distances respectively corresponding to a plurality of sets of interconnects in the layout; and processing an interconnect having a predetermined width in a set of interconnects on the first layer by at least performing a spreading operation on the interconnect based at least in part upon a first spreading distance corresponding to the set of interconnects, wherein the spreading operation offsets a segment of the interconnect by the first spreading distance to create a modified interconnect including two or more bends along the interconnect and the predetermined width while maintaining a remaining portion of the layout unchanged to satisfy one or more design criteria.

23. The article of manufacture of claim 22, the process further comprising:

performing the spreading operation on the interconnect based at least in part upon a second spreading distance;

determining whether the interconnect, upon which the spreading operation has been performed based at least in part upon the second spreading distance, violates one or more design rules;

determining a set of spreading distances that includes the first spreading distance and the second spreading distance;

ordering the set of spreading distances in a first order; and iterating through multiple spreading distances in the set of spreading distances based at least in part upon one or more stopping criteria.

24. The article of manufacture of claim 22, the process further comprising:

identifying a set of design rules;

pre-processing a first interconnect with at least some of the set of design rules by at least augmenting the first interconnect with at least some of the set of design rules; and forwarding information about the first interconnect to the act of performing the spreading operation on the interconnect for modifying the first interconnect.

25. The article of manufacture of claim 22, the process further comprising:

determining whether the interconnect includes a via along the interconnect;

determining whether the via along the interconnect can be moved to another location based at least in part upon the spreading operation or the first spreading distance; and forwarding results of determining whether the via along the interconnect can be moved to the act of performing the spreading operation on the interconnect for modifying the interconnect.

* * * * *